(12) United States Patent
Venugopal et al.

(10) Patent No.: US 12,253,728 B2
(45) Date of Patent: Mar. 18, 2025

(54) OPTICAL COMPONENTS FOR ELECTRONIC DEVICES

(71) Applicant: Apple Inc., Cupertino, CA (US)

(72) Inventors: Vivek Venugopal, Santa Clara, CA (US); Jacky G. Ko, Sunnyvale, CA (US); Ueyn L. Block, Menlo Park, CA (US); James R. Wilson, Saratoga, CA (US); Christopher D. Jones, Los Gatos, CA (US)

(73) Assignee: APPLE INC., Cupertino, CA (US)

( * ) Notice: Subject to any disclaimer, the term of this patent is extended or adjusted under 35 U.S.C. 154(b) by 523 days.

(21) Appl. No.: 17/456,614

(22) Filed: Nov. 26, 2021

(65) Prior Publication Data

US 2022/0342163 A1    Oct. 27, 2022

Related U.S. Application Data

(60) Provisional application No. 63/179,992, filed on Apr. 26, 2021.

(51) Int. Cl.
*G02B 6/42* (2006.01)
*G02B 6/08* (2006.01)
*H01L 31/0232* (2014.01)

(52) U.S. Cl.
CPC ............. *G02B 6/4249* (2013.01); *G02B 6/08* (2013.01); *G02B 6/4202* (2013.01); *H01L 31/0232* (2013.01)

(58) Field of Classification Search
CPC ...... G02B 6/4249; G02B 6/08; G02B 6/4202; H01L 31/0232

USPC .......................................................... 385/120
See application file for complete search history.

(56) References Cited

U.S. PATENT DOCUMENTS

| | | | |
|---|---|---|---|
| 5,665,450 | A | 9/1997 | Day et al. |
| 6,487,351 | B1 | 11/2002 | Cryan et al. |
| 6,892,014 | B2 | 5/2005 | Cok et al. |
| 7,149,393 | B2 | 12/2006 | Kerr et al. |
| 7,251,400 | B1 | 7/2007 | Jacksen |

(Continued)

FOREIGN PATENT DOCUMENTS

| | | |
|---|---|---|
| CN | 1609640 A | 4/2005 |
| CN | 111050637 B | 2/2023 |

(Continued)

OTHER PUBLICATIONS

European Search Report for EP Application No. 21211150.4, mailed Apr. 25, 2022 (8 pp.).

*Primary Examiner* — Jerry M Blevins
(74) *Attorney, Agent, or Firm* — Dorsey & Whitney LLP

(57) ABSTRACT

An electronic device can include a housing defining an aperture, and an electromagnetic radiation emitter and an electromagnetic radiation detector disposed in the housing. An optical component can be disposed in the aperture and can include a first region of a first material having a first index of refraction, the first region aligned with the electromagnetic radiation emitter, a second region of the first material, the second region aligned with the electromagnetic radiation detector, and a bulk region surrounding a periphery of the first region and a periphery of the second region, the bulk region including a second material having a second index of refraction that is lower than the first index of refraction.

19 Claims, 26 Drawing Sheets

(56) References Cited

U.S. PATENT DOCUMENTS

| | | |
|---|---|---|
| 7,272,285 B2 | 9/2007 | Benoit et al. |
| 8,025,818 B2 | 9/2011 | Alkemper et al. |
| 9,297,953 B2 | 3/2016 | Wang et al. |
| 10,150,695 B2 | 12/2018 | Bookbinder et al. |
| 2001/0055456 A1 | 12/2001 | Ellison et al. |
| 2015/0153510 A1 | 6/2015 | Ohara et al. |
| 2017/0102491 A1 | 4/2017 | Lee |
| 2018/0014781 A1* | 1/2018 | Clavelle ............... A61B 5/6824 |
| 2018/0128973 A1* | 5/2018 | Powell ................ H10K 59/879 |
| 2019/0076036 A1 | 3/2019 | Lasarov et al. |
| 2019/0086618 A1* | 3/2019 | Shastri ............... H01S 5/02469 |
| 2021/0302713 A1* | 9/2021 | Schelkanova ............ G02B 6/08 |

FOREIGN PATENT DOCUMENTS

| | | | | |
|---|---|---|---|---|
| EP | 0357070 A2 | | 3/1990 | |
| EP | 3162285 A1 | * | 5/2017 | ......... A61B 5/02416 |
| JP | 2004295890 A | | 10/2004 | |
| WO | WO-2017179507 A1 | * | 10/2017 | ............. H01L 31/12 |

\* cited by examiner

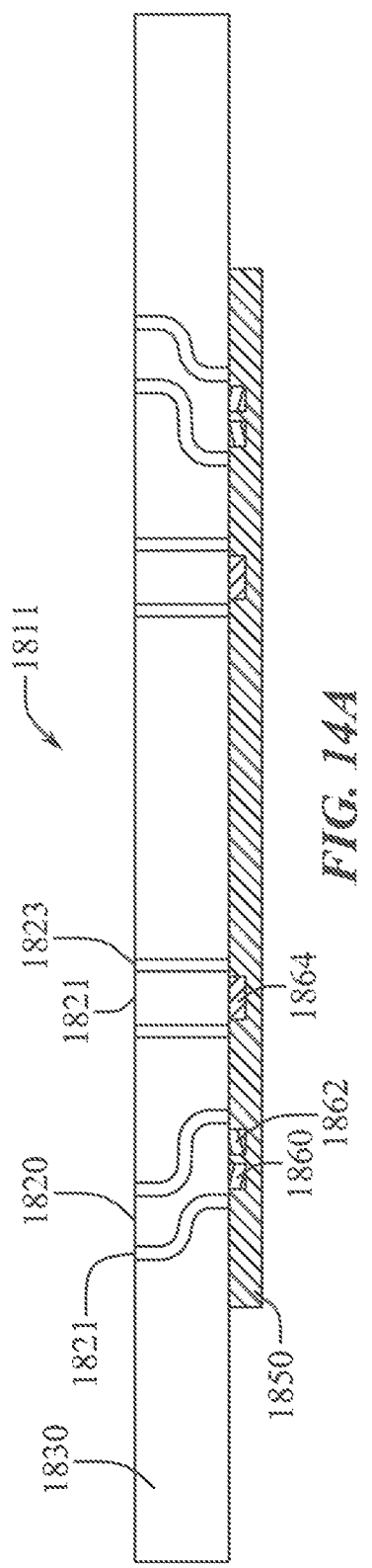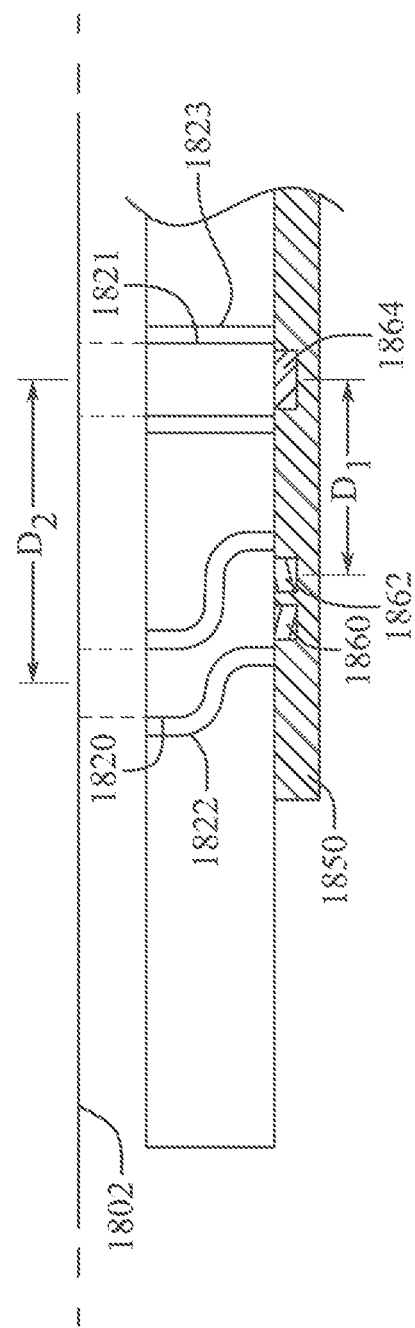

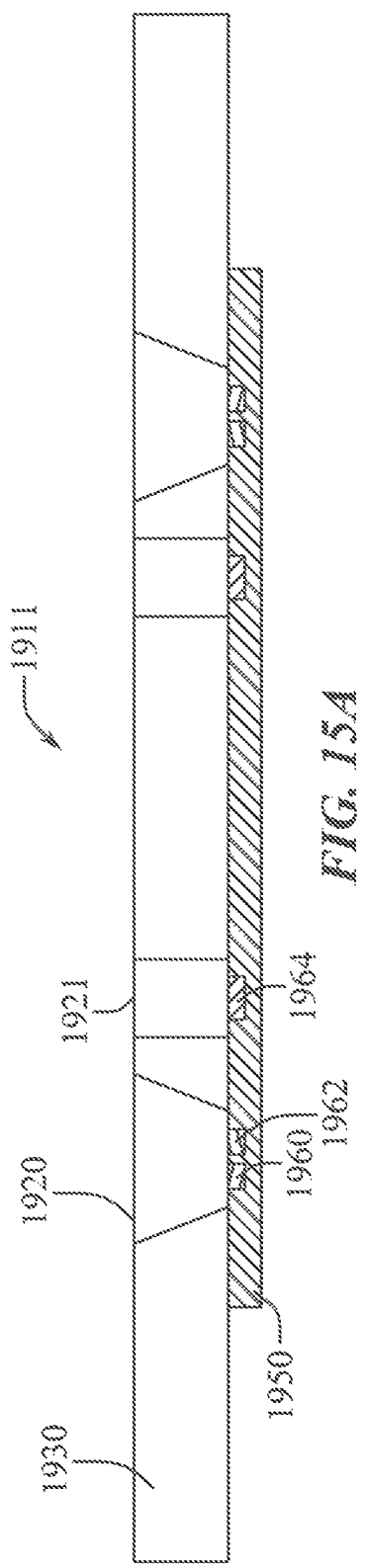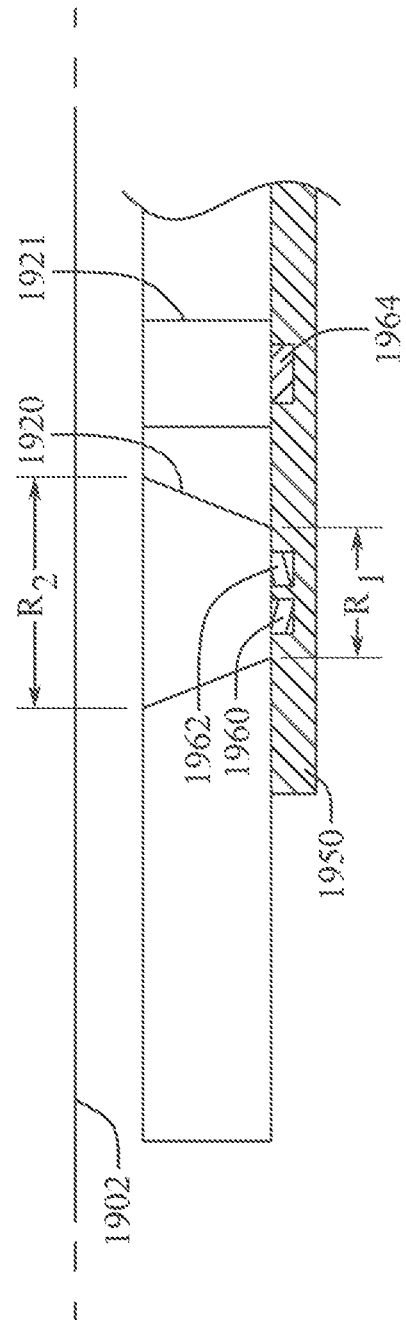

OPTICAL COMPONENTS FOR ELECTRONIC DEVICES

CROSS-REFERENCE TO RELATED APPLICATIONS

This application claims benefit of U.S. Provisional Patent Application No. 63/179,992, filed on Apr. 26, 2021, entitled "Optical Components for Electronic Devices", U.S. Provisional Patent Application No. 63/167,491, entitled "Optical Components for Electronic Devices", and U.S. Provisional Patent Application No. 63/119,231 filed on Nov. 30, 2020, entitled "Optical Components for Electronic Devices", the disclosures of which are incorporated herein in their entirety.

FIELD

The described embodiments relate generally to optical components. More particularly, the present embodiments relate to fiber optic components for electronic devices.

The described embodiments relate generally to optical components. More particularly, the present embodiments relate to fiber optic components for electronic devices.

BACKGROUND

As portable electronic devices continue to include increasingly greater numbers of features, integration of those features into a single device becomes ever more complex. For example, certain features can require both the emission of light from the electronic device, and the detection of light from the ambient environment. The decreasing size of electronic devices, however, can mean that components for detecting and emitting light can be in close physical proximity with one another, increasing the potential for interference or undesired cross-talk between light emitting and light detecting components. Accordingly, it is desirable to provide components that can provide a desired level of optical isolation without undesirably increasing the size of the device.

SUMMARY

According to some aspects of the present disclosure, an electronic device can include a housing defining an aperture and at least partially defining an internal volume of the electronic device, an electromagnetic radiation emitter disposed in the internal volume, an electromagnetic radiation detector disposed in the internal volume, and an optical component disposed in the aperture and at least partially defining an external surface of the electronic device, the optical component including a first region including a first material having a first index of refraction, the first region aligned with the electromagnetic radiation emitter, a second region including the first material, the second region aligned with the electromagnetic radiation detector, and a bulk region at least partially surrounding a periphery of the first region and a periphery of the second region, the bulk region including a second material having a second index of refraction that is lower than the first index of refraction.

In some examples, the bulk region surrounds an entire periphery of the first region, the electromagnetic radiation emitter is a first electromagnetic radiation emitter that emits a first range of wavelengths of light, and the electronic device further includes a second electromagnetic radiation emitter that emits a second range of wavelengths of light different from the first range of wavelengths of light, the second electromagnetic radiation emitter aligned with the first region. The first region includes a third material surrounding a periphery of a portion of the first material, the third material having a third index of refraction that is lower than the first index of refraction. The first region includes an array of portions of the first material, a periphery of each of the portions of the first material surrounded by the third material. The optical component includes an antireflective coating. The first material is chemically strengthened. The second index of refraction is at least 0.2 lower than the first index of refraction. The electromagnetic radiation emitter and the electromagnetic radiation detector are disposed on a mounting component, and the mounting component is attached to the optical component.

According to some aspects, an optical component for an electronic device can include a first region including a first material having a first index of refraction, a periphery of the first region surrounded by a second material having a second index of refraction that is lower than the first index of refraction, and a periphery of the second material surrounded by a third material, a second region including the first material, the second region spaced apart from the first region, a periphery of the second region surrounded by the second material, and a periphery of the second material surrounded by the third material, and a bulk region at least partially surrounding the periphery of the first region and the periphery of the second region, the first region and the second region extending substantially an entire thickness of the bulk region.

In some examples, the bulk region includes the second material. The second region, and the bulk region are fused together. The first region and the second region have different peripheral areas. The first material, the second material, and the third material include glass. The third material includes extra-mural absorption glass.

According to some aspects, an optical component for an electronic device can include a first region including an array of portions of a first material having a first index of refraction, a periphery of each of the portions of the first material surrounded by a second material having a second index of refraction that is lower than the first index of refraction, and a periphery of the array surrounded by a third material, a second region including the first material, a periphery of the second region surrounded by the second material and the third material, the second region spaced apart from the first region, and a bulk region at least partially surrounding the periphery of the first region and the periphery of the second region.

In some examples, the second region includes a second array of portions of the first material, a periphery of each of the portions of the first material surrounded by the second material. The first material includes sapphire and the second material includes glass. The third material includes extra-mural absorption glass. The optical component can further include light absorbing material disposed between the portions of the first material. The second index of refraction is at least 0.25 lower than the first index of refraction.

BRIEF DESCRIPTION OF THE DRAWINGS

The disclosure will be readily understood by the following detailed description in conjunction with the accompanying drawings, wherein like reference numerals designate like structural elements, and in which:

FIG. 14A shows a cross-sectional view of an optical component, light emitters, and a light detector.

FIG. 14B shows a cross-sectional of a portion of the optical component, light emitters, and light detector of FIG. 14A.

FIG. 15A shows a cross-sectional view of an optical component, light emitters, and a light detector.

FIG. 15B shows a cross-sectional of a portion of the optical component, light emitters, and light detector of FIG. 15A.

DETAILED DESCRIPTION

Figure 1:
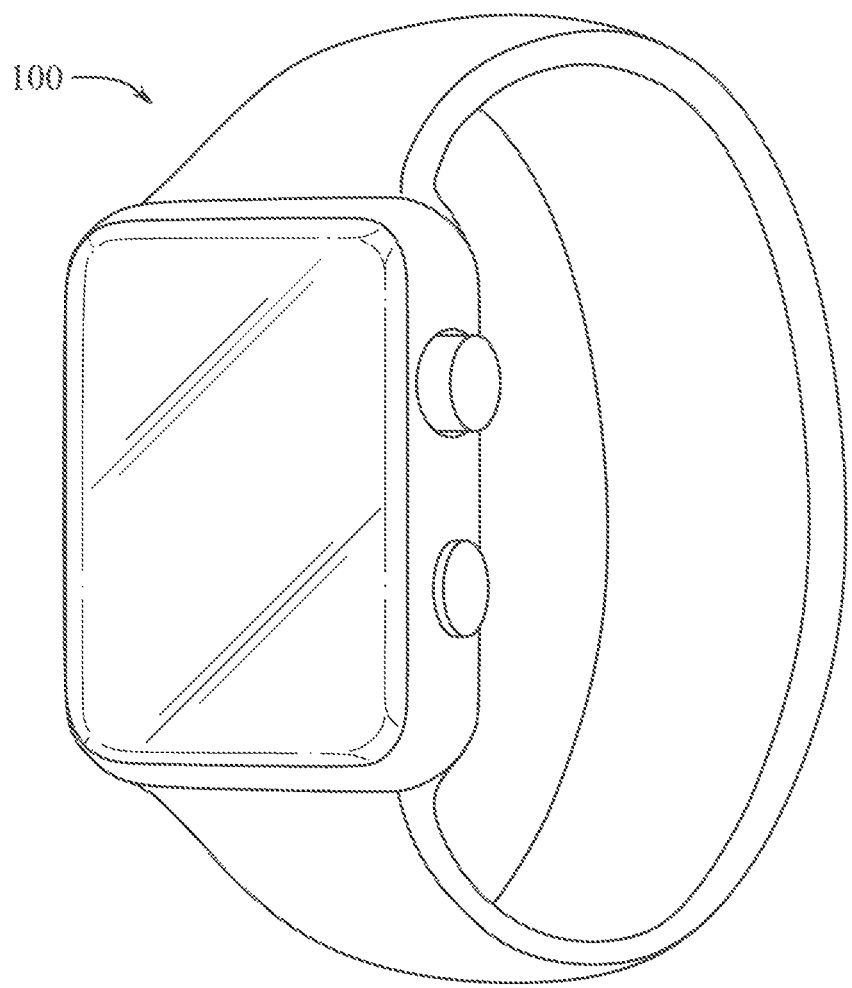
FIG. 1 shows a perspective view of an electronic device.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments and as defined by the appended claims.

In some examples, an electronic device described herein can include a housing or an enclosure that can include an optical component. One or more electromagnetic radiation emitters and detectors can be disposed in the internal volume of the device and can be aligned with the optical component. The optical component can include multiple core regions of a first material having a first index of refraction, with a periphery of each of these regions surrounded by a clad region including a second material having a second index of refraction that is lower than the first index of refraction. The optical component can also include additional regions of material and can be a fused, or a substantially unitary or monolithic body. The difference between the indices of refraction of the core and clad regions can provide a desired amount of optical isolation for electromagnetic radiation that is transmitted through various core regions of the component.

Electronic devices increasingly include components that can detect or otherwise receive information based on the ambient environment outside the electronic device. For example, smartphones typically include visible light detectors, such as cameras, that can receive light from the ambient environment that is then processed into an image that is displayed to a user. In addition to components used for detecting properties of the ambient environment, such as an amount of light, electronic devices also increasingly include components that can transmit or emit signals or information into the ambient environment. Returning to the example of a smartphone including a visible light detector in the form of a camera, such a device can also include a light emitter in the form a light emitting diode flash component. Such an emitting component can work together with a detector to enhance the amount of information detected from the ambient environment. For example, if the electronic device is in an environment that does not contain enough visible light to produce a significant signal on the light detector of the camera, the flash component can be triggered to emit light to illuminate the ambient environment and allow the detector to receive information appropriate to produce an image.

The packaging of both emitters and detectors in a single electronic device, especially emitters and detectors that can operate in the same range of wavelengths of electromagnetic radiation or light, can sometimes lead to the generation of false signals. In the example of a camera, it is desirable that the camera only detect light, and thus generate a signal, from a desired location in the ambient environment. If the device also includes an emitter in the form of a flash, however, the concurrent use of the emitter and the camera can result in a false signal if the camera is not optically isolated from the flash. That is, if the flash emits light that travels to the detector through a pathway that is entirely inside the device, the light incident on the detector will not be entirely from the ambient environment, and thus, will not be an accurate depiction of that environment. This condition is also referred to as light leakage or cross-talk. Accordingly, it can be desirable for emitters that emit electromagnetic radiation detectable by a detector to be internally optically isolated from those detectors.

In addition to camera and flash systems, other electronic device systems can include electromagnetic radiation emitters and detectors. For example, an electronic device can include a vision system designed to assist in providing recognition of an object, or objects. In some instances, the vision system is designed to provide facial recognition of a face of a user of the electronic device. The vision system can include a camera module designed to capture an image, such as a two-dimensional image. The vision system can further include a light emitting module designed to emit several light rays toward the object. The light rays can project a dot pattern onto the object. Further, the light emitting module can emit light in the frequency spectrum of non-visible light, such as infrared light (or IR light). The vision system can further include an additional camera module designed to receive at least some of the light rays reflected from the object, and as a result, receive the dot pattern subsequent to the light rays being reflected by the object. The additional camera module can include a light filter designed to filter out light that is not within the frequency spectrum of light emitted from the light emitting module. As an example, the light filter can include an IR light filter designed to block light that is outside the frequency range for IR light. The additional camera module can provide the dot pattern (or a two-dimensional image of the dot pattern) to a processor in the electronic device.

Other exemplary emitter and detector systems that operate in the same or similar ranges of wavelengths of light can include biometric detection systems. These systems can include components that can emit light and project the light onto a user's body, whereupon the emitted light can be at least partially reflected back from the user's body back toward a detector of the device. As the properties of the emitted light are known and controlled by the emitter, the differences between the properties of the light emitted onto the body and the light reflected therefrom and received by the detector can be used to determine a number of biometric or biological properties of the user's body, such as a user's pulse, heart activity, and/or other similar biometric properties.

These and other assemblies or systems including emitters and detectors can include an opaque structural element inside the device that can serve to enclose and optically isolate the emitter components from the detector components. These structural elements can take the form of walls or chambers that can optically isolate the components in a lateral direction. By their nature, however, the emitters and detectors must have a pathway to emit light to, or receive light from, the ambient environment. Accordingly, transparent coverings such as lenses or glass are typically used to cover the emitters and detectors, and to provide a window to the ambient environment.

Further, it can be desirable for the emitters and detectors of these systems to be disposed relatively near or adjacent to one another, for example, to increase the accuracy or sensitivity of the system. As such, a single lens or transparent cover can be used to provide one or more light paths to the ambient environment for both the emitters and detectors. Even when optically isolated within the housing, such as by an opaque structural element, a light leakage pathway between emitters and detectors can exist through the lens or the cover. For example, where a system both emits and receives light with the ambient environment through a single light or cover, some light from the emitter can be internally reflected within a shared lens or cover to reach a detector without first interacting with the ambient environment. As described above, this can result in cross-talk or false signals, and can undesirably impact the performance of the device.

Accordingly, optical components as described herein, can include one or more portions or regions having different indices of refraction and can act as a lens or cover for the emitters and detectors of a system, while also providing desired levels of optical isolation and without providing any undesirable light pathways, thereby reducing or eliminating any light leakage or cross-talk between emitters and detectors while further optically isolating these components. Further, the unitary and compact nature of these optical components can also eliminate the need for traditional optical isolation components and can allow for increased volume within a device to house additional components, and can facilitate a reduced device size.

These and other embodiments are discussed below with reference to FIGS. 1-16B. However, those skilled in the art will readily appreciate that the detailed description given herein with respect to these Figures is for explanatory purposes only and should not be construed as limiting.

FIG. 1 shows an example of an electronic device 100. The electronic device shown in FIG. 1 is a watch, such as a smartwatch. The smartwatch 100 of FIG. 1 is merely one representative example of a device that can be used in conjunction with the components and methods disclosed herein. The electronic device 100 can correspond to any form of wearable electronic device, a portable media player, a media storage device, a portable digital assistant ("PDA"), a tablet computer, a computer, a mobile communication device, a GPS unit, a remote control device, and other similar electronic devices. The electronic device 100 can be referred to as an electronic device, or a consumer device. Further details of the watch 100 are provided below with reference to FIG. 2.

Figure 2:
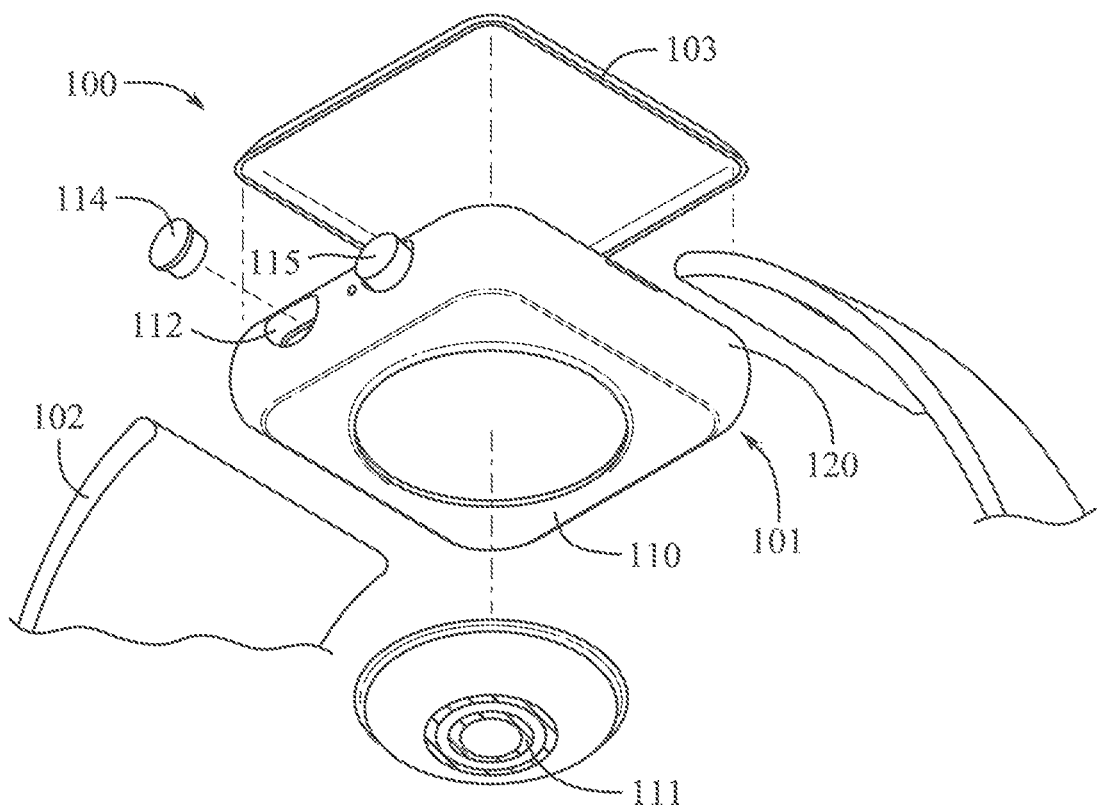
FIG. 2 shows a rear exploded view of the electronic device of FIG. 1.

Referring now to FIG. 2, the electronic device 100 can include a housing 101, and a cover 103 attached to the housing 101. The housing 101 can substantially define at least a portion of an exterior surface of the device 100, and can include a base and sidewalls, such as sidewall 120. The cover 103 can include glass, ceramic, plastic, or any other substantially transparent material, component, or assembly. The cover 103 can cover or otherwise overlay a display, a camera, a touch sensitive surface such as a touchscreen, or other component of the device 100. The cover 103 can define a front exterior surface of the device 100.

A back cover 110 can also be attached to, or can form part of, the housing 101, for example, opposite the cover 103. The back cover 110 can include ceramic, plastic, metal, or combinations thereof. In some examples, the back cover 110 can include an optical component 111, also referred to as an at least partially electromagnetically transparent component 111. The electromagnetically transparent component 111 can include one or more portions that are transparent to any desired wavelength of electromagnetic radiation, such as visual light, infrared light, radio waves, or combinations thereof, with one or more opaque portions disposed between the electromagnetically transparent portions. In some examples, the transparent portions of the optical component 111 can be disposed over one or more electromagnetic radiation emitters and/or detectors, while the opaque portions can inhibit or prevent electromagnetic radiation emitted by an emitter from leaking to a detector along an undesirable pathway. Together, the housing 101, the cover 103, and the back cover 110 can substantially define an interior volume and an exterior surface of the device 100.

The device 100 can also include internal components, such as a haptic engine, a battery, and a system in package (SiP), including one or more integrated circuits, such as processors, sensors, and memory. The SiP can also include a package. The device 100 can further include one or more electromagnetic radiation emitters and detectors, such as light emitting diodes, cameras, optical detectors, infrared detectors, and other detectors and/or emitters. These emitters and detectors can be associated with one or more systems of the device, such as a camera system, a vision system, and/or a biometric system. The internal components, such as one or more emitters and detectors, can be disposed within an internal volume defined at least partially by the housing 101, and can be affixed to the housing 101 via internal surfaces, attachment features, threaded connectors, studs, posts, or other features, that are formed into, defined by, or otherwise part of the housing 101 and/or the cover 103 or back cover 110. In some examples, the attachment features can be formed relatively easily on interior surfaces of the housing 101, for example, by machining.

The housing 101 can be a substantially continuous or unitary component and can include one or more openings 112 to receive components of the electronic device 100, such as a button 114, and/or provide access to an internal portion of the electronic device 100. In some examples, the device 100 can include input components such as one or more buttons 114 and/or a crown 115.

The electronic device 100 can further include a strap 102 or any other component designed to attach the device 100 to a user or to otherwise provide wearable functionality. In some examples, the strap 102 can be a flexible material that can comfortably allow the device 100 to be retained on a user's body at a desired location. Further, the housing 101 can include a reception feature or features 113 therein that can provide attachment locations for the strap 102. In some examples, the strap 102 can be retained on the housing 101 by any desired techniques. For example, the strap 102 can include magnets that are attracted with magnets disposed within the housing 101, or can include retention components that mechanically retain the strap 102 against the housing 101 within the reception feature 113, or combinations thereof. Further details of an example optical component 111 are provided below with reference to FIG. 3.

Figure 3:
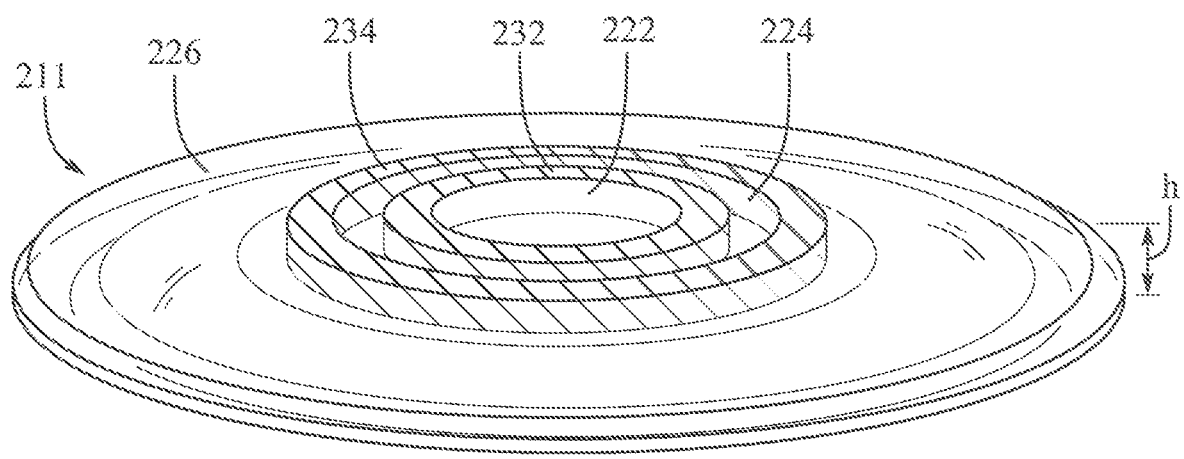
FIG. 3 shows a perspective view of an optical component of an electronic device.

FIG. 3 shows a perspective view of an optical component 211 of an electronic device. The optical component 211 can be similar to, and can include some or all of the features of, the optical component 111 described with respect to FIG. 2. As can be seen in FIG. 3, the component 211 can include a first region 222, a second region 224, and a third region 226 that have a first index of refraction. In some examples, and as illustrated, the second region 224 can surround the first region 222 while the third region 226 can surround both the first and second regions 222, 224. It should be understood, however, that the optical component 211 can include any number of regions in any arrangement, geometry, or configuration, as described herein. FIG. 3 illustrates just one particular exemplary arrangement of the transparent regions 222, 224, 226.

Continuing with FIG. 3, a fourth region 232 can be disposed between the first and second regions 222, 224, and a fifth region 234 can be disposed between the second and third regions 232, 234. The fourth region 232 and the fifth region 234 can have a second index of refraction that is different from the first index of refraction of the regions 222, 224, 226. In this example, the fourth and fifth regions 232, 234 can entirely surround the perimeter of the respective adjacent regions 222, 224, although in some other examples, one or more regions may not entirely surround any other region. In some examples, the surfaces of the regions 222, 224, 226 and the regions 232, 234 can be level, flush, or in line with one another and can collectively define a surface of the component 211, and can at least partially define the exterior surface of an electronic device, such as device 100. The term "flush" means to be approximately even or level at a surface or within generally the same plane. A "flush" surface can include two or more contiguous surfaces. In some examples, a flush surface can have an average surface roughness ($R_a$) of less than 10 microns, less than 5 microns, less than 1 micron, less than 0.75 microns, less than 0.5 microns, less than 0.25 microns, or less than 0.1 microns or smaller. In some examples, the regions 232, 234 can extend an entire thickness or height "h" of the component 211. In some examples, the different index of refraction of the regions 232, 234 can prevent electromagnetic radiation, such as visible or infrared light, from being transmitted from one region to another region.

The first, second, and third regions 222, 224, 226, and the fourth and fifth regions 232, 234 can be formed from, or can include, substantially any material having the desired levels of transmissivity or opaqueness in any desired range of electromagnetic radiation. For example, the regions 222, 224, 226 can be formed from, or can include, a material that is transparent to electromagnetic radiation in the visible light spectrum, to infrared light, to ultraviolet light, to radio waves, or to any other desired range of wavelengths of light. Further, the regions 222, 224, 226, 232, 234 need not be completely transparent to the desired range or ranges of wavelengths of light. For example, any of the regions 222, 224, 226, 232, 234 can be 90% transparent, 80% transparent, 70% transparent, 50% transparent, 25% transparent, or even lower for certain applications.

In some examples, any of the regions 222, 224, 226, 232, 234 can include or be formed from any material that is substantially opaque to a desired range of wavelengths of light, such as ceramic or polymeric materials. In some examples, one or more regions 222, 224, 226, 232, 234 can be formed from or can include any desired material, such as ceramics or polymeric materials. In some examples, any of the regions 222, 224, 226, 232, 234 can include the same or a similar material as one or more other regions 222, 224, 226, 232, 234. In some examples, any of the regions 222, 224, 226, 232, 234 can be formed from the same or a similar material as one or more of the other regions 222, 224, 226, 232, 234, and can further include dyes, additives, or pigments that can block or absorb light in a desired range of wavelengths.

In some examples, one or more regions 222, 224, 226, 232, 234 can be formed from, or can include, any desired material, such as ceramics, glass-ceramics, polymeric materials, or combinations thereof. In some examples, any of the regions 222, 224, 226, 232, 234 can include ceramic materials such as glass, glass-ceramics, sapphire, zirconia, spinel and/or other ceramic materials transparent to a desired range of wavelengths of light. In some examples, any of the regions 222, 224, 226, 232, 234 can be formed from polymeric materials, such as polycarbonate, acrylics, polyvinyl chloride, polyethylene terephthalate, and/or other polymeric materials transparent to a desired range of wavelengths of light. In some examples, one or more regions 222, 224, 226, 232, 234 can include a ceramic material and one or more other regions 222, 224, 226, 232, 234 can include a polymeric material. Various examples of optical components are described below with reference to FIGS. 4-6.

Figure 4:
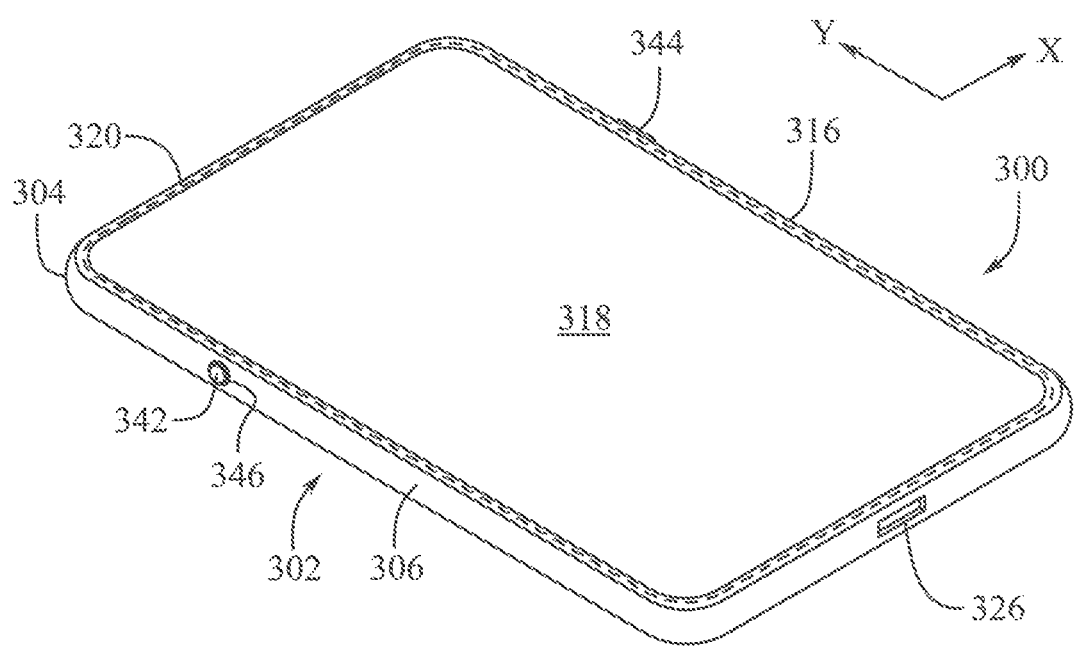
FIG. 4 shows a front perspective front view of an electronic device.

FIG. 4 illustrates a perspective view of an example of an electronic device 300. The electronic device 300 shown in FIG. 4 is a mobile wireless communication device, such as a smartphone. The smartphone of FIG. 4 is merely one representative example of a device that can be used in conjunction with the systems and methods disclosed herein. Electronic device 300 can correspond to any form of wearable electronic device, a portable media player, a media storage device, a portable digital assistant ("PDA"), a tablet computer, a computer, a mobile communication device, a GPS unit, a remote-control device, or any other electronic device. The electronic device 300 can be referred to as an electronic device, or a consumer device.

The electronic device 300 can have a housing that includes a frame or a band 302 that defines an outer perimeter and a portion of the exterior surface of the electronic device 300. The band 302, or portions thereof, can be joined to one or more other components of the device as described herein. In some examples, the band 302 can include several sidewall components, such as a first sidewall component 304, a second sidewall component 306, a third sidewall component 308 (opposite the first sidewall component 304), and a fourth sidewall component (not shown in FIG. 4). The sidewall components can be joined, for example, at multiple locations, to one or more other components of the device, as described herein.

In some instances, some of the sidewall components form part of an antenna assembly (not shown in FIG. 4). As a result, a non-metal material or materials can separate the sidewall components of the band 302 from each other, in order to electrically isolate the sidewall components. The aforementioned materials can include an electrically inert or insulating material(s), such as plastics and/or resin, as non-limiting examples. Further, as described herein, one or more of the sidewall components can be electrically connected to internal components of the electronic device, such as a support plate, as described herein. In some examples, these electrical connections can be achieved by joining a sidewall component to an internal component, for example, as part of the antenna assembly.

The electronic device 300 can further include a display assembly 316 (shown as a dotted line) that is covered by a protective cover 318. The display assembly 316 can include multiple layers (discussed below), with each layer providing a unique function. The display assembly 316 can be partially covered by a border or a frame that extends along an outer edge of the protective cover 318 and partially covers an outer edge of the display assembly 316. The border can be positioned to hide or obscure any electrical and/or mechanical connections between the layers of the display assembly 316 and flexible circuit connectors. Also, the border can include a uniform thickness. For example, the border can include a thickness that generally does not change in the X- and Y-dimensions.

The protective cover 318 can be formed from a transparent material, such as glass, plastic, sapphire, or the like. In this regard, the protective cover 318 can be referred to as a transparent cover, a transparent protective cover, or a cover glass (even though the protective cover 318 sometimes does not include glass material). Further, in some examples, the protective cover 318 can include some or all of the features of the optical components described herein. In some examples, the protective cover 318 can include one or more regions overlying an emitter and/or detector, for example, as associated with a vision system, and can also include one or more bulk regions at least partially surrounding the overlying regions and having a different index of refraction, as described herein.

The electronic device 300 can further include a port 326 designed to receive a connector of a cable assembly. The port 326 allows the electronic device 300 to communicate data (send and receive), and also allows the electronic device 300 to receive electrical energy to charge a battery assembly. Accordingly, the port 326 can include terminals that electrically couple to the connector.

The electronic device 300 can include several control inputs designed to facilitate transmission of a command to the electronic device 300. For example, the electronic device 300 can include a first control input 342 and a second control input 344. The aforementioned control inputs can be used to adjust the visual information presented on the display assembly 316 or the volume of acoustical energy output by an audio module, as non-limiting examples. The controls can include one of a switch or a button designed to generate a command or a signal that is received by a processor. The control inputs can at least partially extend through openings in the sidewall components. For example, the second sidewall component 306 can include an opening 346 that receives the first control input 342. Further details regarding the features and structure of an electronic device are provided below, with reference to FIG. 5.

Figure 5:
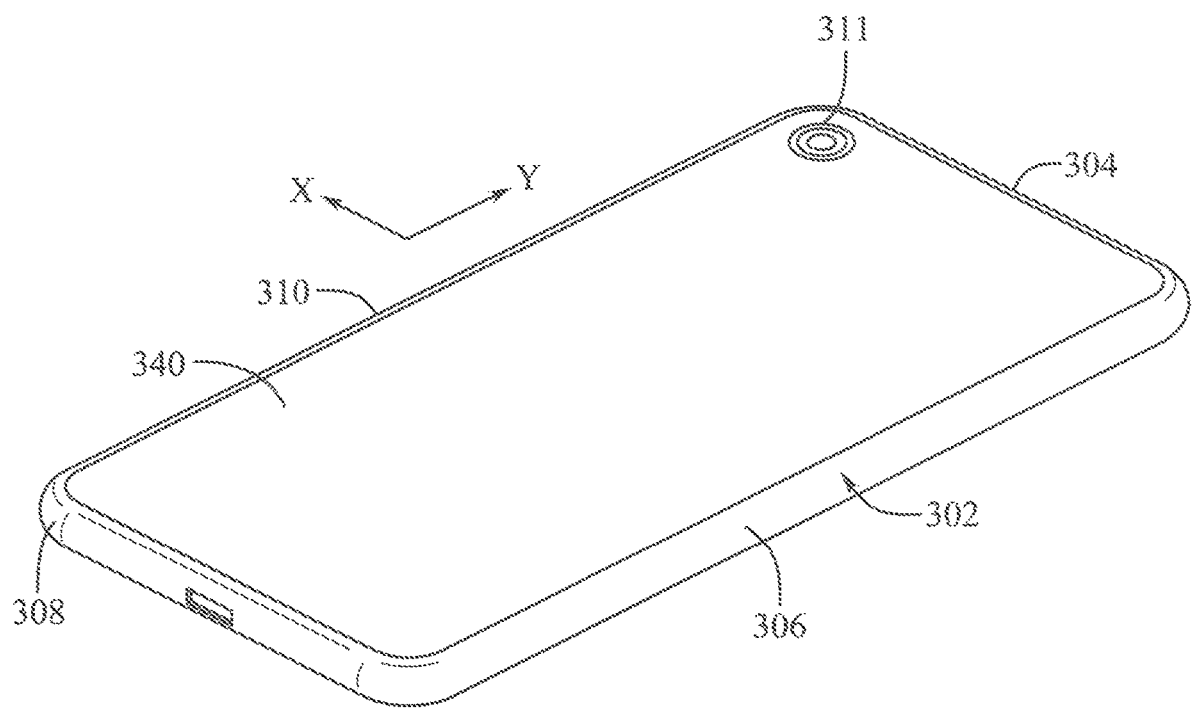
FIG. 5 shows a rear perspective view of the electronic device of FIG. 5

FIG. 5 shows a rear perspective view of the electronic device of FIG. 4. As can be seen, the device 300 can further include a back cover or back protective layer 340 that can cooperate with the band 302 and the protective cover 318 to further define the internal volume and exterior surface of the device 300. The back cover 340 can be formed from any desired material, such as, metals, plastics, ceramics, or composites. In some examples, the back cover 340 can be formed from the same or a similar material as the protective cover 318. In some examples, the back cover 340 can be a conductive transparent material, such as indium titanium oxide or a conductive silica. In some examples, the back cover 340 can define an aperture or an orifice that can receive an optical component 311, as described further herein. Additionally, in some examples, the back cover 340 itself can include some or all of the features of the optical components described herein. For example, the back cover 340 can include one or more regions having a first index of refraction and one or more other regions having a second, different index of refraction.

Figure 6:
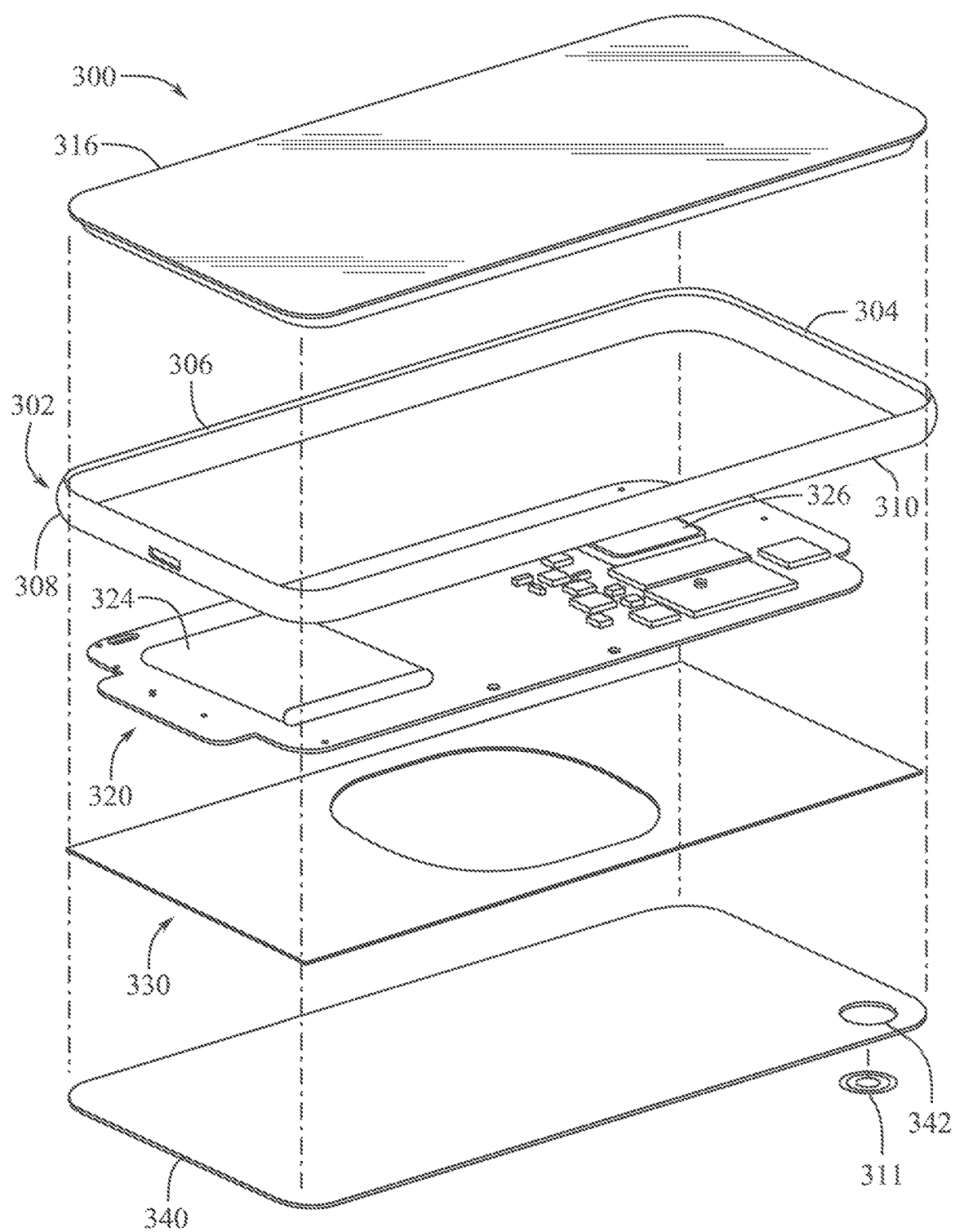
FIG. 6 shows an exploded perspective view of the electronic device of FIG. 5.

FIG. 6 illustrates a perspective exploded view of the electronic device 300. The housing of the device 300, including the band 302, can include one or more features to receive or couple to other components of the device 300. For example, the band 302 can include any number of features such as apertures, cavities, indentations, and other mating features to receive and/or attach to one or more components of the device 300.

The device 300 can include internal components, such as a system in package (SiP), including one or more integrated circuits such as a processors, sensors, and memory. The device 300 can also include a battery housed in the internal volume of the device 300. The device 300 can also include one or more sensors, such as optical or other sensors, that can sense or otherwise detect information regarding the environment exterior to the internal volume of the device 300 as described further herein. Additional components, such as a haptic engine, can also be included in the device 300. The electronic device 300 can also include a display assembly 316, as described herein. In some examples, the display assembly 316 can be received by, and/or be attached to, the band 302 by one or more attachment features. In some examples, one or more of these internal components can be mounted to a circuit board 320. The electronic device 300 can further include a support plate 330, also referred to as a back plate or chassis, that can provide structural support for the electronic device 300. The support plate 330 can include a rigid material, such as a metal or metals.

Such components can be disposed within an internal volume defined, at least partially, by the band 302, and can be affixed to the band 302, via internal surfaces, attachment features, threaded connectors, studs, posts, and/or other fixing features, that are formed into, defined by, or otherwise part of the band 302. For example, attachment feature 322 can be formed in the band 302. In some examples, the attachment feature 322 can be formed by a subtractive process, such as machining.

The back cover 340 can also be attached to the band 302, for example, via the one or more attachment features 322, or by any other desired techniques, for example, by an adhesive. The back cover 340 can define at least one aperture 342 that can overlie or be aligned with one or more internal components of the device 300, such as one or more electromagnetic radiation emitters and/or detectors. Such emitters and detectors can be included as part of a vision system, a camera system, a biometric system, or any other systems, as described herein. An optical component 311 can be disposed in the aperture 342, or can be disposed or retained by one or more other components such that the optical component 311 can be disposed over or occlude the aperture 342. The optical component 311 can include at least two regions having different indices of refraction, as described herein.

Any number or variety of electronic device components can include an optical component, as described herein. The process for forming such an optical component can include any combination of joining, bonding, co-forming, or fusing the regions together, as described herein. The optical component can include a flush external surface defined by the regions having different indices of refraction. Various examples of optical components as described herein, and processes for forming the same are described below with reference to FIGS. 7A-10B.

Figure 7A:
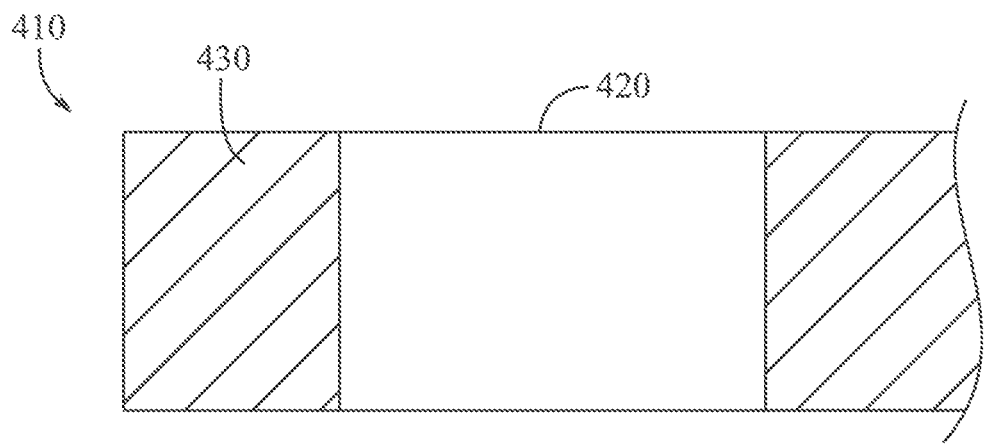
FIG. 7A shows a cross-sectional view of an optical component.

FIG. 7A shows a cross-sectional view of a portion of an optical component 410. In some examples, the optical component 410 can be substantially similar to, and can include some or all of the features of any of the optical components described herein. In this particular example, the optical component 410 includes a region of a first material 420 at least partially surrounded by a region of a second material 430. In some examples, the first material 420 can have a first index of refraction, and the second material 430 can have a second index of refraction that is lower than the first index of refraction. In some examples, the second material can surround the periphery of the region of first material 420. As described further herein, the first material and/or the second material can include substantially any materials that are at least partially transparent to a desired range of wavelengths of electromagnetic radiation, such as visible light. Further, the second material 430 can be fused or directly attached to the first material 420. That is, in some examples, there may be no adhesive or intermediate material between the first material 420 and the second material 430. In some examples, the first material 420 can be thermally bonded or fused to the second material 430.

This arrangement of a relatively low refractive index material 430 surrounding a relatively high refractive index material 420 in the optical component 410 can ensure that light which enters the material 420 can be transmitted through the entire region of material 420 without undesirably exiting the material 420 at the interface between the material 420 and the material 430. That is, the relative low index material 430 means that a high percentage of light that enters material 420 is totally internally reflected within the material 420 because of the mismatch in indices of refraction between the materials 420, 430. In some examples, the region of the material 420 can be considered a fiber optic material as described further herein. In some examples, the region of the material 420 can be referred to as an aperture, even though the region may not actually define a physical aperture or opening.

Figure 7B:
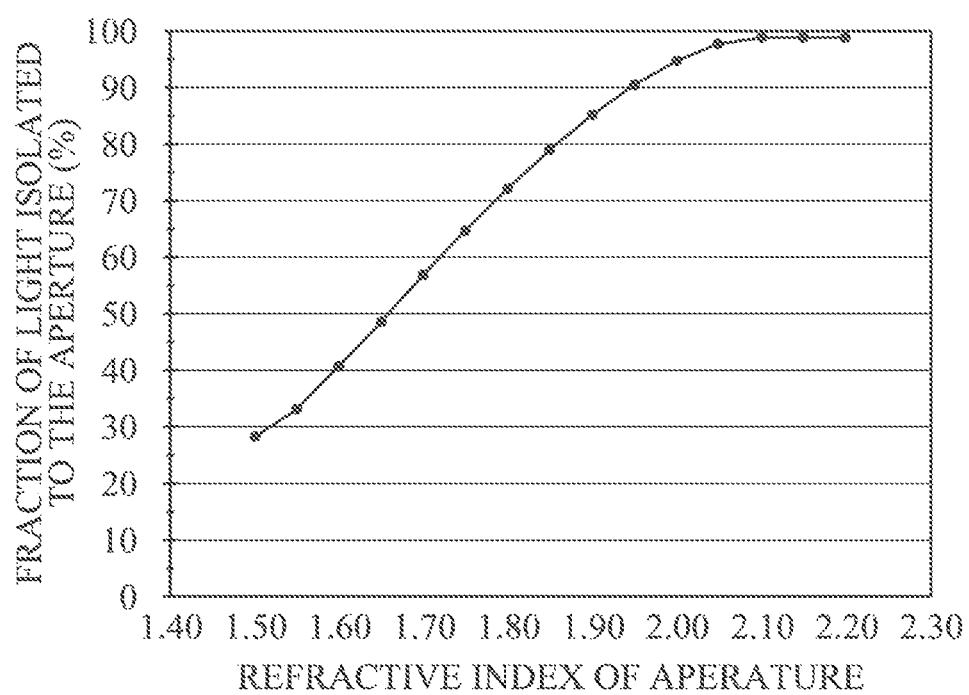
FIG. 7B shows a graph of the fraction of emitted light isolated to an aperture versus the refractive index of the aperture.

FIG. 7B shows a graph of the fraction of emitted light isolated to the region of the first material 420, also referred to as the aperture, versus the index of refraction of the material 420. In this particular example, the material 430 can include a ceramic material, such as a high strength glass, and can have an index of refraction of about 1.52. As can be seen, the higher the index of refraction of the material 420 as compared to the material 430, the greater the percentage of light that is isolated to the region of the first material 420. The present graph is obtained by measuring the amount of light exiting the area directly above the region of the first material 420 and comparing this value with the total light output from a source positioned directly below the region of the first material 420. Accordingly, the higher the fraction of light isolated to the region of the first material 420 means that less light is able to escape from the region of the first material 420 to cause undesirable interference or crosstalk in a device including the optical component 410. Further details of the optical components described herein are discussed below with reference to FIGS. 7C and 7D.

Figure 7C:
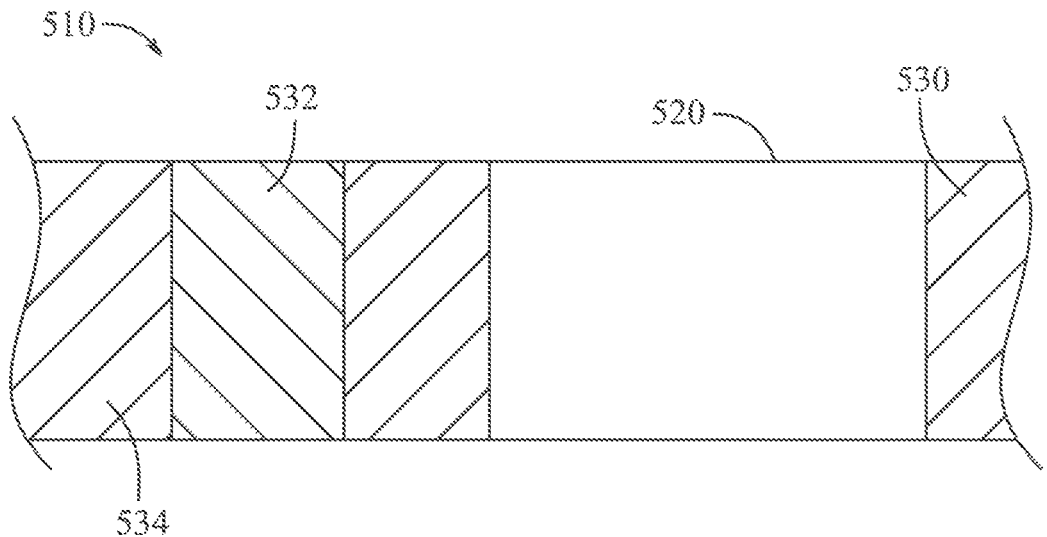
FIG. 7C shows a cross-sectional view of an optical component.

FIG. 7C shows a cross-sectional view of a portion of an optical component 510 that can be substantially similar to, and can include some or all of the features of any of the optical components described herein. In some examples, the optical component 510 can include a region of a first material 520 having a first index of refraction, and a region of a second material 530 surrounding a periphery of the first region. The second material 530 can have an index of refraction that is less than the first index of refraction. Additionally, a third material 532 can at least partially surround a periphery of the first region 520 and/or the second region 530. In some examples, the third material 532 can be a light-absorbing material. That is, the third material 532 can absorb one or more desired ranges of wavelengths of light. In some examples, the third material 532 can include a same or similar material to the first or second materials 520, 530, but can also include a dye, a pigment, or another material that can absorb light. In some examples, the third material 532 can include an extra-mural absorption (EMA) glass.

The configuration of the optical component 510 shown in FIG. 7C, including the region of the light absorbing material 532, can serve to further block any of the relatively small amount of light that might escape from the region of the first material 520, thereby reducing undesirable interference or crosstalk in a device including the optical component 510. In some examples, and as described further herein, the periphery of the regions of material 520, 530, 532 can be at least partially surrounded by a bulk material 534. This bulk material can be the same, similar, or different than any of the materials 520, 530, 532. In some examples, all of the materials 520, 530, 532, and 534 can be fused together to form a substantially continuous, unitary, or monolithic optical component 510.

Figure 7D:
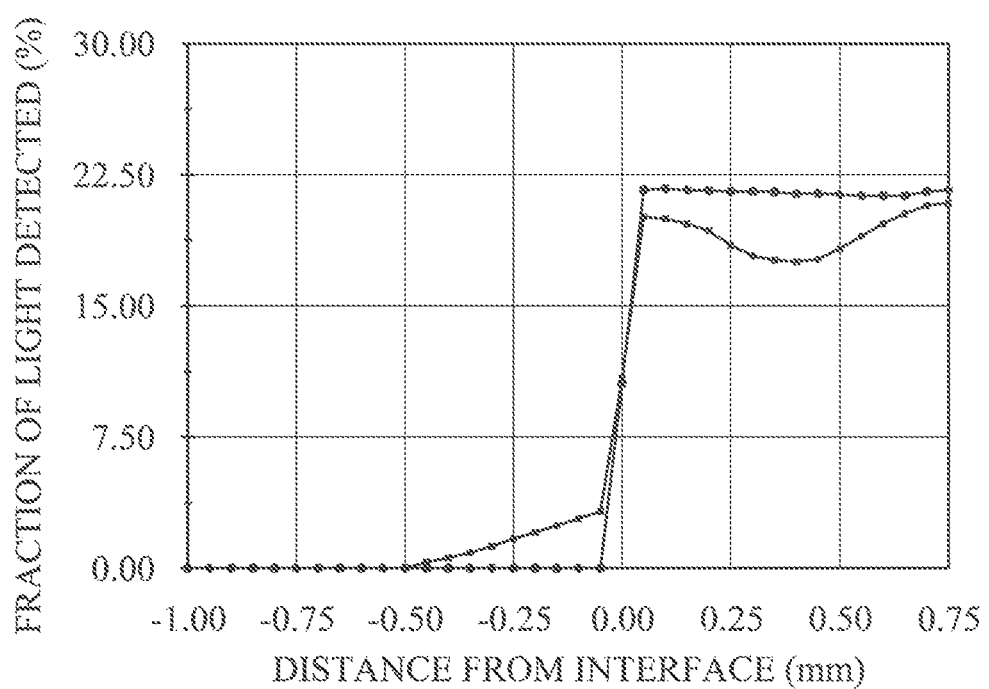
FIG. 7D shows a graph of the fraction of light collected by an aperture versus the distance of a light source from the aperture.

FIG. 7D shows a graph of the fraction of light collected by the region of material 520 as a light source is moved from the interface between the light absorbing material 532 and the bulk material 534 towards the interface between the region of material 520 and the material 530 for two different examples of an optical component 510. In both examples, the material 530 has an index of refraction of 1.52. In one example, the material 520 has an index of refraction of 1.72 (a difference of 0.2), while in the other example, the material 520 has an index of refraction of 1.82 (a difference of 0.3). The fraction of light collected below the optical component at the material 520 was measured. As can be seen, the configuration of the regions of the optical component 510 prevent all or substantially all of the light from exiting the region of material 520 until the light source is very close to, or past, the interface between the materials 520 and 530. Thus, the optical component 510 can effectively serve to isolate a detector positioned under the material 520 from light unless the light is incident on the exterior surface of the material 520. Further, as can be seen, the higher the index of refraction of the material 520, the more effective isolation is achieved. Further details of the arrangement of various regions of materials of optical components will now be described below with reference to FIGS. 8A-8D.

Figure 8A:
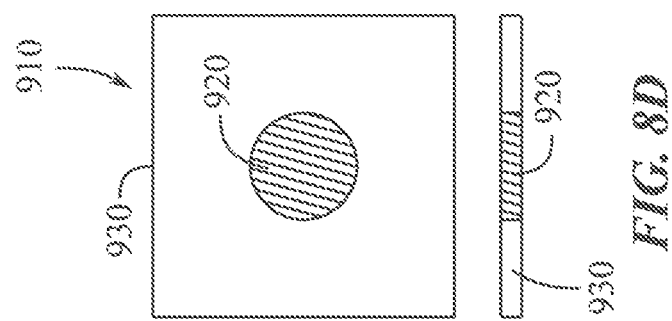
FIG. 8A shows schematic top and cross-sectional views of a portion of an optical component.

FIG. 8A shows schematic top and cross-sectional side views of a portion of an optical component 610. The optical component 610 can be substantially similar to, and can include some or all of the features of any of the optical components described herein. The portion shown in FIG. 8A can represent some or all of the optical component 610. In some examples, the optical component 610 can include a core region 620 that can include a material having a relatively high index of refraction, such as a fiber optic material, for example silica. In some examples, the material of the core 620 can include quartz, and/or a glass having a high index of refraction. In some examples, the core material 620 can have an index of refraction between about 1.4 and about 1.6.

In some examples, a periphery of the high refractive index core 620 can be surrounded by a light absorbing material 622, such as a ceramic light absorbing material, for example, an EMA glass. A periphery of the fiber optic material 620 and the light absorbing material 622 can be surrounded by a bulk region including a material 630 that can have a lower index of refraction than the core 620. In some examples, the bulk material 630 can include a ceramic material. In some examples, the bulk material 630 can include zirconium oxide. In some examples, the material 630 can include a glass, such as an aluminosilicate or a borosilicate glass. In some examples, a difference between the index of refraction of the core 620 and the bulk region 630 can be between 0 and 0.7, for example, about 0.2, 0.25, or 0.3. In some examples, the index of refraction of the material 620 may not be constant throughout the entire area or depth of the region 620. That is, in some examples, the index of refraction of the region 620 can have a first value at one location in the region and a second, different value at a second, different location. In some examples, the index of refraction of the region 620 can change along a gradient between the first and second locations. For example, the region 620 can have a first index of refraction at the center of the region 620, and a second, different index of refraction at the edge of the region 620, with the change in the index of refraction between the core and the edge defining a gradient. In some examples, the change in index can be adjusted as desired by doping the material of the region 620, and or by performing one or more chemical treatment and/or ion exchanged processes on the region 620. In some examples, the index of refraction at the edge of the region can be lower than the center and can be selected to match, or more closely match the index of refraction of the region 630. In some examples, the gradient of the index of refraction in the region 620 can be selected or designed in order to curve light into, out of, or within the region 620 as desired.

Additionally, any of the material properties of the region 620 can define a gradient across the region, including the hardness, ability to bond to region 630, CTE, opacity, and any other property or properties. In some examples, the region 620 can be doped by a thermal diffusion based process, and/or by coextruding at least a portion of the region 620 with another material that has a different composition to form a region 620 defining a property gradient. In some examples, a doped exterior portion of the region 620 can have a different value or level of one or more material properties than the center or interior portion of the region 620. In some examples, the doped exterior (that is, the portion adjacent to the region 630) can be softer and have a lower glass transition temperature ($T_g$) than the center of region 620 in order to provide for a stronger, more durable, and/or easier to form thermal bond between the regions 620, 630.

In some examples, the material 622 may not be light absorbing, and may instead be a light-reflecting material. For example, the region 622 can include a reflective material, such as a metal or metallic coating of the region 620. In some examples, this reflective material can serve to further confine any light travelling through region 620, and can prevent light from entering the region 630. Additionally, the material of region 622 can include a colored material, including substantially any color and level of opacity desired. In some examples, the color and level of opacity can be selected for aesthetic purposes. In some examples, the color and/or opacity of any region 620, 622, 630 can be selected as desired, for aesthetic purposes and/or to provide for increased transmission of one or more wavelengths of light relative to one or more other wavelengths.

Figure 8B:
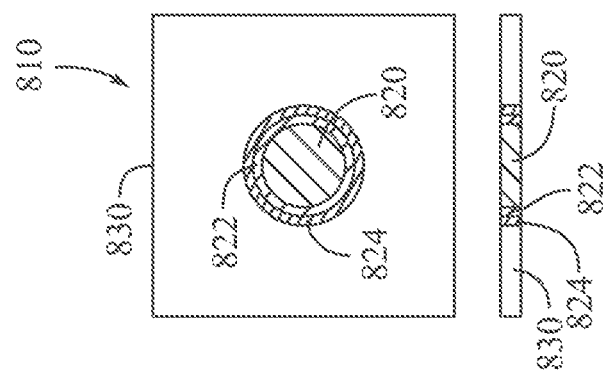
FIG. 8B shows schematic top and cross-sectional views of a portion of an optical component.

In some examples, the material 622 may not be a light absorbing material, and can include any material or materials, as desired. For example, the material 622 can be a metallic material, a ceramic material, a glass material, and/or combinations thereof. In some examples, the material 622 can be selected to have a material property or properties that is between the values of that material property for the regions 620 and 630. That is, where the region 620 may have a relatively high coefficient of thermal expansion (CTE) and region 630 may have a relatively lower CTE, the material 622 can be selected to have a CTE between the CTEs of regions 620 and 630. In this way, the material 622 can reduce the stresses experienced by the component 610 as a whole. In some examples, FIG. 8B shows schematic top and cross-sectional side views of a portion of an optical component 710. The optical component 710 can be substantially similar to, and can include some or all of the features of any of the optical components described herein. The portion shown in FIG. 8B can represent some or all of the optical component 710. In some examples, the optical component 710 can include a core region 720 that can include a material having a relatively high index of refraction, such as a fiber optic material, for example silica. In some examples, the core material 720 can have an index of refraction between about 1.4 and about 1.6. In some examples, however, the core region 720 can have substantially any desired index of refraction. In some examples, a periphery of the high refractive index core 720 can be surrounded by a light absorbing material 722, such as a ceramic light absorbing material, for example, an EMA glass. A periphery of the fiber optic material 720 and the light absorbing material 722 can be surrounded by a bulk region including a material 730. In some examples, this bulk region can include a same material as the core region 720.

Figure 8C:
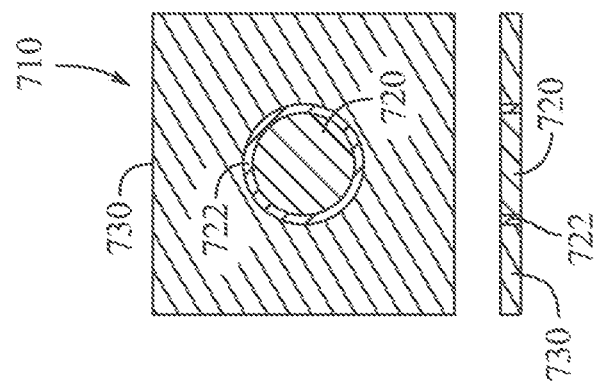
FIG. 8C shows schematic top and cross-sectional views of a portion of an optical component.

FIG. 8C shows schematic top and cross-sectional side views of a portion of an optical component 810. The optical component 810 can be substantially similar to, and can include some or all of the features of any of the optical components described herein. The portion shown in FIG. 8C can represent some or all of the optical component 810. The optical component 810 can include a core region 820 that includes a material that is transparent to one or more desired ranges of wavelengths of light. For example, the core region 820 can include a polymer or a ceramic material. In some examples, the core region 820 can include a glass, such as an aluminosilicate or borosilicate glass. A periphery of the core region 820 can be surrounded by a region of a second material 822, such as a fiber optic material, for example silica. In some examples, the second material 822 can have an index of refraction that is lower than the core material 820. For example, the second material 822 can have an index of refraction that is between about 0.01 and about 0.8 lower than the index of refraction of the core material 820.

In some examples, the periphery of the core 820 and the second material 822 can be surrounded by a light absorbing material 824, such as a ceramic light absorbing material, for example, an EMA glass. A periphery of the materials 820, 822, 824 can be surrounded by a bulk region including a material 830. In some examples, the material 830 can be substantially similar to, or the same as, the material 820. Thus, the material 830 can include a material that is transparent to one or more desired ranges of wavelengths of light. For example, the bulk region 830 can include a polymer or a ceramic material.

In some examples, as described with respect to region 622, the material 824 can include a light-reflecting material, such as a metal or metallic coating. Additionally, in some examples, where the component 810 is formed from a drawing or fusion process, as described further herein, the metallic material 824 can have a melting point that is near or below the operating temperature of the drawing or fusion process, while still maintaining its desired shape, location, and reflective properties. In some examples, the material 824 can be a glass and/or ceramic material that can have a relatively low glass transition temperature ($T_g$), or softening temperature, compared to one or more of the other regions 820, 822, 830. In some examples, this relatively low $T_g$ material 824 can allow a drawing or fusion process to be carried out at a lower temperature than if the material 824 were not present, and can further serve to provide a stronger bond between the layers 822 and 830 than might otherwise be achieved.

Indeed, in some examples, a relatively low $T_g$ material can be disposed between any two regions 820, 822, 824, 830 of the component 810, or any of the regions of any of the components described herein.

Figure 8D:
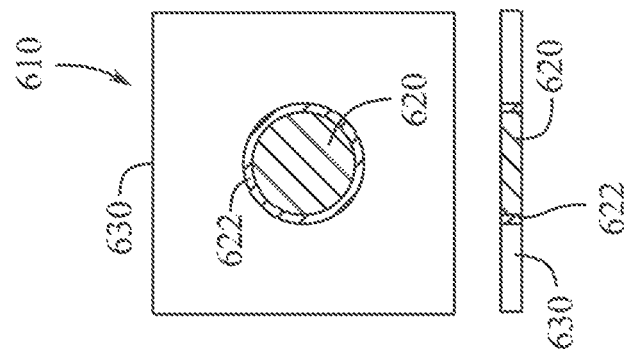
FIG. 8D shows schematic top and cross-sectional views of a portion of an optical component.

FIG. 8D shows schematic top and cross-sectional side views of a portion of an optical component 910. The optical component 910 can be substantially similar to, and can include some or all of the features of any of the optical components described herein. The portion shown in FIG. 8D can represent some or all of the optical component 910. In some examples, the optical component 910 can include a core region 920 that can include a material having a relatively high index of refraction, for example above about 1.4, above about 1.5, above about 1.7, or above about 1.8 or even higher. In some examples, the material of the core region 920 can include a polymer or ceramic material, such as a glass.

A periphery of the core region 920 can be surrounded by a bulk region including a material 930 that can have a lower index of refraction than the core 920. In some examples, the bulk material 930 can include a ceramic material. In some examples, the bulk material 930 can include a glass having a lower index of refraction than a glass material of the core 920. In some examples, the material 930 can include a glass, such as an aluminosilicate or borosilicate glass. In some examples, a difference between the index of refraction of the core 920 and the bulk region 930 can be between 0 and 0.7, for example, about 0.2, 0.25, or 0.3.

The various regions of material described with respect to any of the examples of FIGS. 8A-8D can be bonded or fused to one another by any desired process. In some examples, such as where multiple regions of the optical components 610, 710, 810, 910 include a ceramic material, such as a glass and/or sapphire, the regions can be fused to one another as described herein. Further any optical component described herein can include a first portion having the configuration shown in any of FIGS. 8A-8D, and one or more other portions having a same or different configuration as shown in any of FIGS. 8A-8D.

In some examples where any of the regions of the components 610, 710, 810, 910 can include a ceramic material, that material can be a glass-ceramic material that can be heated and crystallized, or ceramed, to a desired level of crystallinity and/or opacity. In some examples, the material can initially be a glass material and can be processed to form a glass-ceramic material having one or more desired properties. In some examples, a glass-ceramic material can be treated until it is opaque or has a desired level of opacity. In some examples, this processing can be done before, during, and/or after the formation of a component, including the material. In some examples, any of the regions of the components 610, 710, 810, 910 can thus include a glass-ceramic material that can include one or more amorphous phases and one or more crystalline and/or polycrystalline phases. In some examples, the degree of crystallization of the glass-ceramic material can be selected as desired, for example by controlling the starting material and/or process conditions under which the material is crystallized. In some examples, a glass-ceramic region of any of the components 610, 710, 810, 910 can have a crystallinity of between about 10% and about 95%, or between about 30% and about 90%.

In some examples, any of the regions of the components 610, 710, 810, 910 can include one or more types of glass, such as aluminosilicate, borosilicate, lithium containing glass, lithium and sodium containing glass, lithium and aluminum and silicon containing glass, sulfur containing glass, chalcogenide glass, or any other desired type of glass. In some examples, any of the regions of the components 610, 710, 810, 910 can include one or more types of ceramic material, including silica, sapphire, fused quartz, diamond, and/or zirconia.

In some examples, any of the regions of the components 610, 710, 810, 910 can include a material that may be opaque to optical wavelengths of light, but can be at least partially transparent to one or more wavelengths of infrared light, including short wavelength infrared light, mid wavelength infrared light, and/or long wavelength infrared light.

In some examples, the materials of the optical components 610, 710, 810, 910 can have coefficients of thermal expansion (CTE) that are within a desired amount of the other materials of the optical components 610, 710, 810, 910. By tuning any differences between the CTEs of the various materials of the optical components 610, 710, 810, 910, the buildup of thermal stresses in the optical components 610, 710, 810, 910 during processing, manufacturing, and/or use can be reduced. In some examples, one material of an optical component 610, 710, 810, 910 can be within about $10 \times 10^{-6}$ m/(m K), about $5 \times 10^{-6}$ m/(m K), about $3 \times 10^{-6}$ m/(m K), or about $1 \times 10^{-6}$ m/(m K), or less of any other material of the optical component 610, 710, 810, 910, including an adjacent material. In some examples, the CTE of any portion of material can be tuned as desired, for example, by doping the portion or portions of material. In some examples, adjacent portions of material, such as regions 920 and 930, can be selected, doped, or tuned to have a same or similar CTE. In some examples, however, the materials of any two portions or regions can be selected to deliberately provide a mismatch in CTE. In some examples, such a mismatch can be desirable because it can produce compressive stresses which can result in a stronger or more durable component. For example, the materials of regions 920, 930 can be selected so that the CTE mismatch between the materials can put the region 920 under compression.

In some examples, any of the regions of the components 610, 710, 810, 910, whether they be made of glass, sapphire, metal, ceramic, or any other material, can be adhered together using glue or one or more other adhesives. In at least one example, such an adhesive material can be a low index material compared with one or more adjacent or adhered regions 610, 710, 810, 910 such that light transmission through the regions 610, 710, 810, 910 internally reflects off the boundary between the region and the adhesive layer to direct the transmission of light through the regions 610, 710, 810, 910. Adhesive materials and glues can also be used to adhere multiple regions or portions of optical components described elsewhere herein and shown in the other figures.

In some examples, the core regions 620, 720, 820, 920 of the optical components 610, 710, 810, 910 described with respect to FIGS. 8A-8D can assume substantially any shape and can have substantially any desired peripheral area and/or thickness. Further, any of the optical components 610, 710, 810, 910 can include core regions having different sizes and/or shapes. For example, a core region 620, 720, 820, 920 can be substantially circular or cylindrical and can have a diameter of from about 0.01 mm to about 10 mm, from about 0.1 mm to about 5 mm, from about 0.5 mm to about 3 mm, or from about 1 mm to about 3 mm. Additionally, an optical component including multiple core regions 620, 720, 820, 920 can have a separation distance between adjacent core regions of less than about 5 mm, less than about 3 mm, less than about 1 mm, less than about 0.5 mm, or even less than about 0.25 mm or less. Additional details regarding the formation and structure of optical components for electronic devices are described below with reference to FIGS. 9A-10B.

Figure 9A:
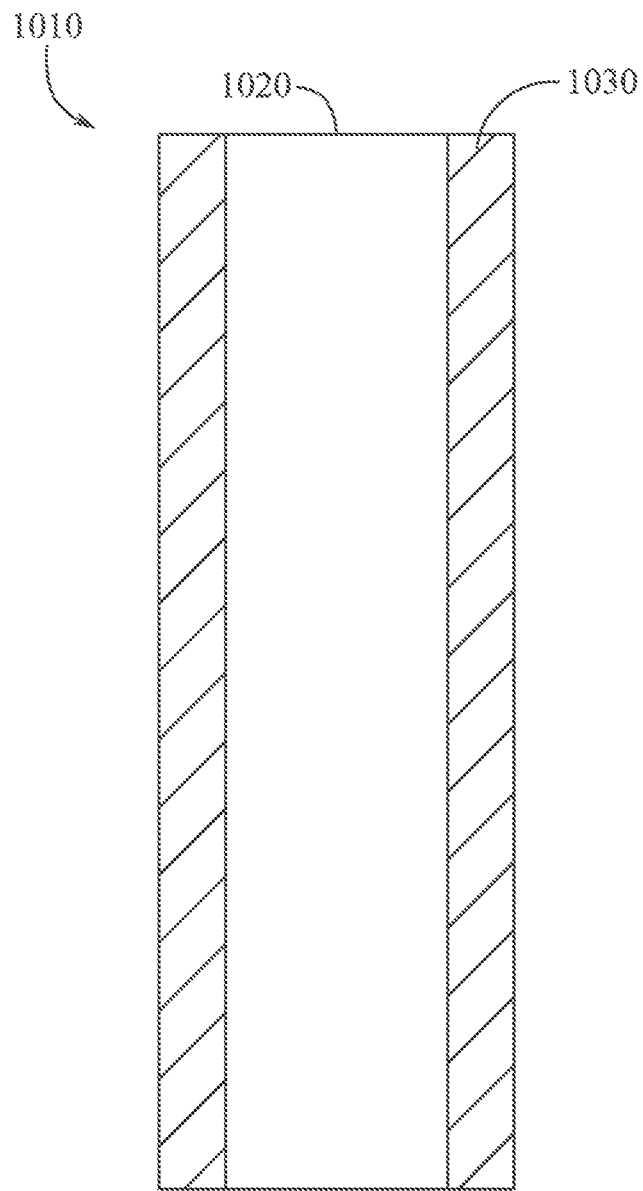
FIG. 9A shows a cross-sectional view of a portion of an optical fiber.

FIG. 9A shows a cross-sectional view of a portion of an optical fiber 1010. Although referred to as a fiber, the portion 1010 can assume substantially any desired shape or size and can include some or all of an optical component, as described herein. In some examples, a fiber 1010 can include a first region, or core region 1020 including a first material having a first index of refraction, and a second region, clad region, or peripheral region 1030 that can surround a periphery of the core region 1020 and that can include a second material having a second index of refraction that is lower than the first index of refraction. As described with respect to FIGS. 8A-8D, a difference between the index of refraction of the core material 1020 and the clad material 1030 can be between 0 and 0.7, for example, about 0.2, 0.25, or 0.3.

The core region 1020 can include substantially any material that is transparent to one or more desired ranges of wavelengths of light, such as visible light and/or infrared light, and has a desired index of refraction. For example, the core material 1020 can include a transparent polymer or ceramic material. In some examples, the core region can include sapphire, fused quartz, diamond, silica, and/or a glass material, such as aluminosilicate glass or borosilicate glass. In some examples, the material of the clad region 1030 can include any desired material including ceramic and/or polymeric materials. In some examples, the clad material 1030 can be transparent to one or more desired ranges of wavelengths of light, such as visible light and/or infrared light, and can have a desired index of refraction that is lower than the index of refraction of the core material 1020. In some examples, however, the clad material 1030 can absorb or block one or more desired ranges of wavelengths of light.

In some examples, such as where the core material 1020 and the clad material 1030 include ceramic materials, including glass, the fiber 1010 can be formed by a fusion drawing process. That is, the core material 1020 and the clad material 1030 can be heated to a desired temperature and can be drawn through an aperture together to form the fiber 1010. Accordingly, in some examples, even when the core material 1020 and the clad material 1030 are different materials, the core material 1020 can be fused to the clad material 1030 so that the fiber 1010 is a unitary or monolithic body. That is, the core material 1020 and the clad material 1030 can be ionically and/or covalently bonded to one another.

In some examples, the core material 1020 can include a type of glass that is chemically strengthenable. In some examples, the core material 1020 can be a type of glass that can be strengthened by one or more chemical processes, such as one or more ion exchange process. In some examples, the core material 1020 can include an aluminosilicate glass that has been subjected to, or can be subjected to one or more chemical strengthening processes. In some examples, the chemical strengthening processes can include one or more ion exchange processes that involve the exchange of potassium, sodium, and/or lithium. As described further herein, in some examples, the core material 1020 can be chemically strengthened prior to being drawn into a fiber 1010, after being drawn into the fiber 1010, and/or after the fiber 1010 has been incorporated into an optical component.

In some examples, the clad material 1030 can be a type of glass that can be strengthened by one or more chemical processes, such as one or more ion exchange process. In some examples, both the core material 1020 and the clad material 1030 can be strengthened by one or more chemical processes, such as one or more ion exchange process. In some examples, the core material 1020 and the clad material 1030 can be chemically strengthened, but at different rates, to different depths, and/or at different amounts. For example, one or more ion exchange processes can exchange ions to a deeper depth in the core material 1020 than in the clad material 1030. In some examples, however, one or more ion exchange processes can exchange ions to a deeper depth in the clad material 1030 than in the core material 1020. As described further herein, in some examples, the core material 1020 and/or clad material 1030 can be chemically strengthened prior to being drawn into a fiber 1010, after being drawn into the fiber 1010, and/or after the fiber 1010 has been incorporated into an optical component.

In some examples, one of the core material 1020 or clad material 1030 can include a lithium and sodium containing glass, while the other of the core material 1020 or clad material 1030 can include a lithium containing glass. In some examples, the lithium and sodium containing glass can be subjected to a potassium and sodium ion exchange process, while the lithium containing glass may only be subjected to a sodium ion exchange process. The two material can be subjected to the same or different sodium ion exchange processes, as desired.

In some examples, one or both of the core material 1020 or clad material 1030 can be subjected to multiple ion exchange processes, as desired. In some examples, one or both of the core material 1020 or clad material 1030 can be subjected to a first ion exchange process that can have a relatively deep penetration depth, and a second ion exchange process that can have a shallower penetration depth, but that can have a high concentration of ions exchanged. In this way, one or both of core material 1020 or clad material 1030 can have a stepwise ion exchange profile.

Figure 9B:
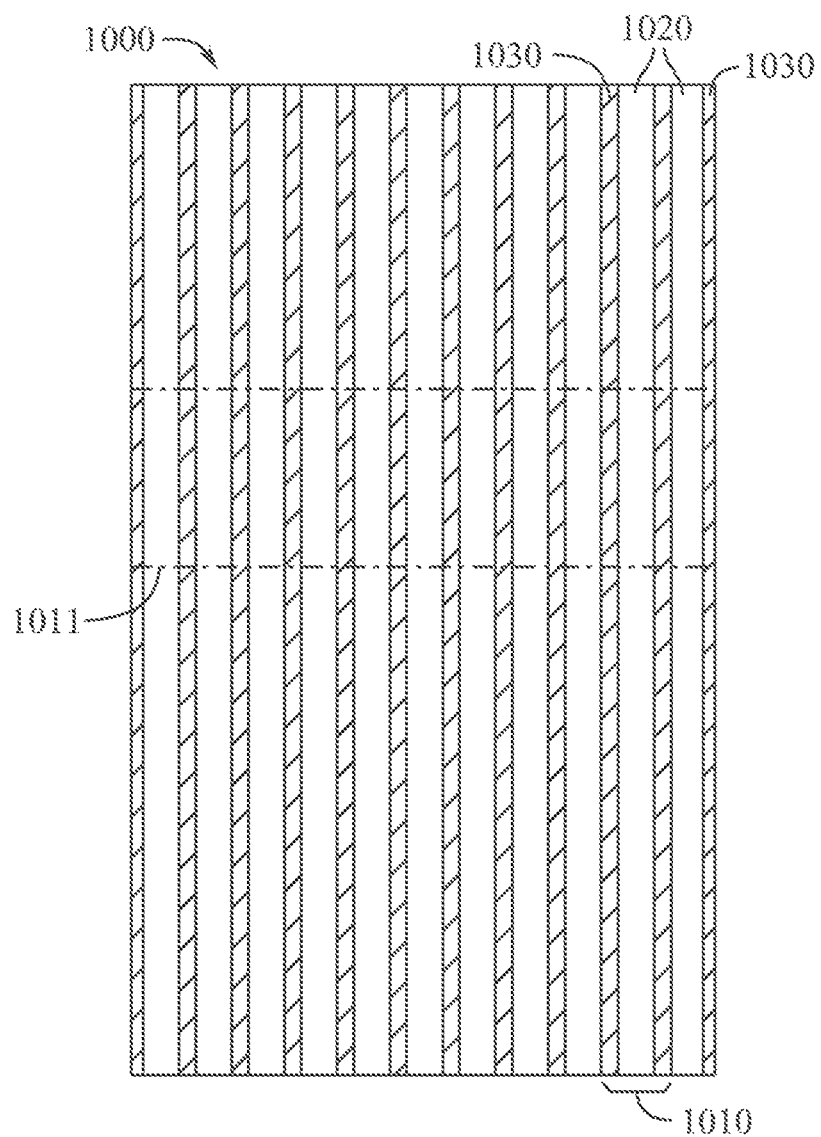
FIG. 9B shows a cross-sectional view of an array of optical fibers.

FIG. 9B shows a cross-sectional view of an array of optical fibers 1010 that have been formed into a bundle or a boule 1000. In some examples, multiple fibers 1010, such as those described with respect to FIG. 9A, can be positioned adjacent to one another, such as in a stacked array, and the fibers 1010 can be subjected to a fusion drawing process. That is, the fibers 1010 can be heated and drawn through an aperture or opening to fuse the fibers 1010 to one another. In some examples, the fibers 1010 can be ionically and/or covalently bonded to one another. In some examples, the fusions drawing process can be repeated multiple times, as desired, to form a boule 1000 having a desired number of fibers 1010. That is, a first array of fibers 1010 can be drawn into a boule 1000 and multiple boules 1000 can be positioned adjacent to one another and subjected to a fusion draw processes to form a larger boule 1000. In some examples, the boule 1000 can be heated in a mold after being subjected to a fusion drawing process. In some examples the boule 1000 can additionally or alternatively be subjected to an elevated pressure or pressures in the mold. In some examples, a fusion drawing process can reduce a diameter or size of the fibers 1010 or boule 1000 a desired amount so that the finally formed boule 1000 has regions of material 1020, 1030 having desired diameters or widths.

Although the boule 1000 is illustrated as including multiple regions of core material 1020 and clad material 1030, in some examples, the fibers 1010 including the boule 1000 can include any number of additional coatings or regions of material. For example, an electrically and/or thermally conductive material can be disposed between any of the core 1020 and clad 1030 regions of the boule 1000. In some examples, one or more of the core regions 1020 and/or clad regions 1030 can include an electrically and/or thermally conductive material itself, instead of the optical materials described herein. In some examples, the material of any of the core regions 1020 and/or clad regions 1030 can have any of the optical properties described herein and can also be electrically and/or thermally conductive.

In some examples, the electrically and/or thermally conductive material can include any electrically and/or thermally conductive material that can withstand a fusion drawing process and its associated temperatures. That is, the electrically and/or thermally conductive material can be any electrically and/or thermally conductive material that can retain a desired level of electrical and/or thermally conductivity after being exposed to temperatures of up to about 250° C., up to about 350° C., up to about 450° C., or even higher. In some examples, the electrically and/or thermally conductive material can include any desired metal or ceramic material. For example, the electrically and/or thermally conductive material can include a high temperature metal alloy. In some examples, the electrically and/or thermally conductive material can include an electrically and/or thermally conductive ceramic material. The electrically and/or thermally conductive material can be positioned in the boule 1000, and in the optical component 1011 that can be formed therefrom, at any desired location or locations, to provide an electrically and/or thermally conductive pathway from one surface of the component 1011 to an opposite surface of the component 1011. This electrically and/or thermally conductive material can be used in an optical component to enable electrical and/or thermal communication between two opposing surfaces and can, for example, enable an optical component 1011 to additionally or alternatively be used as electrical leads or electrodes and/or for thermal sensing. In some examples, an optical component 1011 including one or more regions of electrically and/or thermally conductive material can be used as electrical contacts to charge an electronic device including the component 1011, or as contacts for one or more sensors of the device.

Figure 9C:
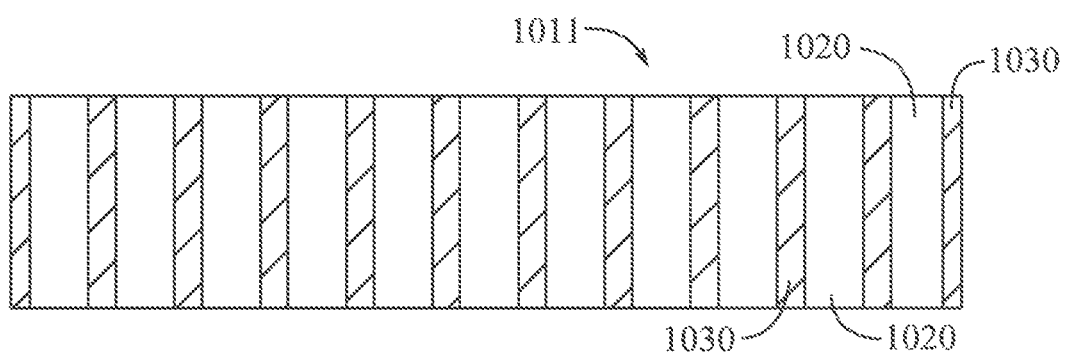
FIG. 9C shows a cross-sectional view of a fiber optic plate.

As described further with respect to FIG. 9C, after forming the boule 1000, a portion 1011 of the boule 1000 having desired dimensions can be removed from the boule 1000 to form an optical component or plate 1011. In some examples, multiple portions forming an optical component or plate 1011 having desired dimensions can be removed from a single boule 1000. The plate 1011 can be removed by any desired process or processes, such as machining, cutting, and/or laser cutting. In some examples, the plate 1011 can be removed and/or subjected to further subtractive processing so that it can have substantially any peripheral shape. In some examples, multiple plates 1011 having different dimensions and/or orientations can be removed from the same boule 1000. For example, a plate 1011 can be removed such that certain of the fibers 1010 are in desired locations with respect to the periphery of the plate 1011.

FIG. 9C shows a cross-sectional view of a plate 1011, also referred to as an optical component 1011 or fiber optic plate 1011. As can be seen, the core regions 1020 can extend an entire thickness of the plate 1011 in order to transmit light incident on one surface of the core regions 1020 to an opposite surface. In some examples, the plate 1011 can be used to selectively transmit light from one surface of the plate 1011 to an opposite surface of the plate 1011. Further, although the plate 1011 is illustrated as defining flat surfaces, in some examples, the plate 1011 can define one or more concave surfaces, one or more convex surfaces, and/or one or more irregular or non-planar surfaces.

Figure 10A:
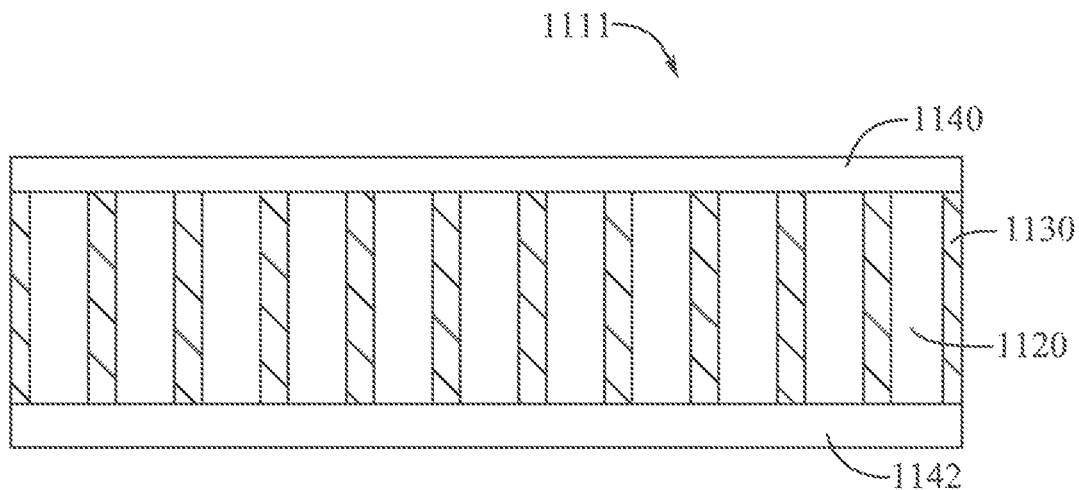
FIG. 10A shows a cross-sectional view of a fiber optic plate.

FIG. 10A shows a cross-sectional view of a plate 1111 that can be substantially similar to, and can include, some or all of the features of the optical components described herein, such as the plate 1011 described with respect to FIG. 9C. The plate 1111 can be formed through one or more fusion drawing processes and can include an array of core regions 1120 including a material having a first index of refraction, with a periphery of each of the core regions 1120 surrounded by a clad region 1130 that can include a material having a second index of refraction that is lower than the first index of refraction. The plate 1111 illustrated in FIG. 10A has been subjected to one or more processes after being formed and can include a first surface coating 1140 formed on a first surface defined by the core regions 1120 and clad regions 1130. The plate 1111 can also include a second surface coating 1142 formed on a second surface defined by the core regions 1120 and clad regions 1130 that is opposite the first surface. In some examples, a plate 1111 can include a surface coating on a single surface or a portion thereof, or on two or more surfaces, or portions thereof.

In some examples, one or both of the coatings 1140, 1142 can include an anti-reflective coating. That is, one or both of the coatings 1140, 1142 can assist in the prevention of backscattering of light passing through the plate 1111, and can prevent or reduce light emitted from the plate 1111 from reentering the plate 1111. In some examples, an anti-reflective coating can include any desired transparent material, such as one or more polymeric and/or ceramic materials. In some examples, one or both of the coatings 1140, 1142 can have an index of refraction such that any light emitted from a core region 1120 cannot be internally reflected through the coating 1140, 1142 to reenter the plate 1111. That is, in some examples, one or both of the coatings 1140, 1142 can have an index of refraction low enough that substantially all of a cone of light exiting the plate 1111 will escape the plate 1111 and will not be totally internally reflected. This can further reduce or prevent cross-talk between adjacent core regions 1120 of the plate 1111.

In some examples, the index of refraction and any other optical properties of one or both of the coatings 1140, 1142 can be selected so that the coatings 1140, 1142 prevent or reduce the occurrence of total internal reflection when the environment adjacent to one or more surfaces of the plate 1111 has an index of refraction different than air. That is, one or both of the coatings 1140, 1142 can be selected so that the coatings 1140, 1142 prevent or reduce the occurrence of total internal reflection when the plate 1111 is immersed in water or another medium.

In some examples, one or both of the coatings 1140, 1142 can include a decorative coating. In this way, a decoration, a color, or a design can be coated on one surface of the plate, such as at the location of coating 1142, and can be readily viewable from the other, opposite surface of the plate 1111, while the plate 1111 itself can prevent the coating 1142 from being scratched or otherwise damaged or degraded from environmental exposure. In some examples, one or both of the coatings 1140, 1142 can include a mirrored or partially mirrored coating. In some examples, one or both of the coatings 1140, 1142 can include a scratch-resistant coating. That is, one or both of the coatings 1140, 1142 can have a hardness higher than either or both of the core regions 1120 or clad regions 1130.

Figure 10B:
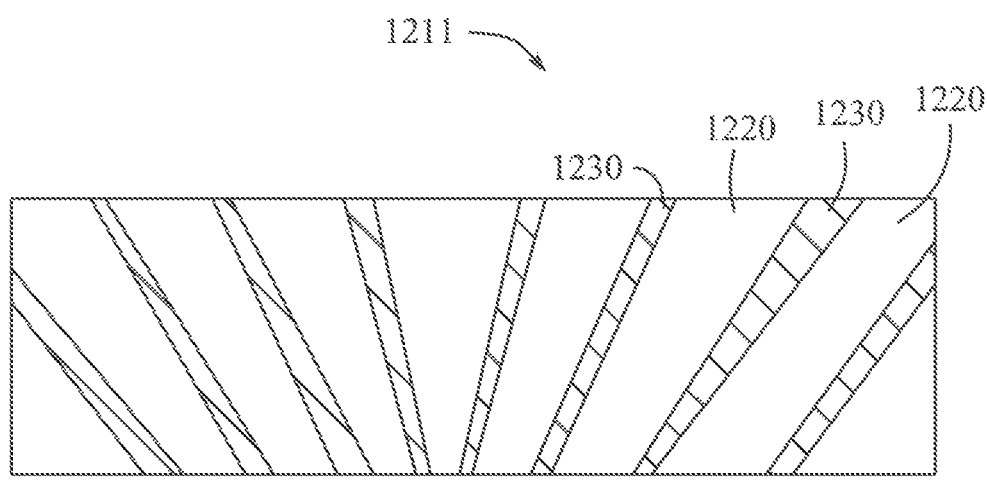
FIG. 10B shows a cross-sectional view of a fiber optic plate.

FIG. 10B shows a cross-sectional view of a plate 1211 that can be formed according to the processes described herein, such as one or more fusion drawing processes. Although the fusion drawing processes described with respect to FIGS. 9A-9C maintained a parallel orientation of the fibers, in some examples, the fusion drawing process can be controlled so that part of a boule or fiber array is preferentially drawn, and the fibers can be angled relative to one another. The plate 1211 can be removed from a portion of the boule that includes fibers at a desired angle or orientation with respect to one another, or an exterior surface of the plate 1211. In some examples, the fibers can be angled up to about 1 degree, about 5 degrees, about 10 degrees, about 15 degrees, or about 30 degrees or more with respect to one another or an exterior surface of the plate 1211.

Alternatively, or additionally, as shown in FIG. 10B, in some examples, this angled drawing process can result in regions 1220, 1230 of the plate 1211 that can expand or shrink in peripheral area along the thickness of the plate 1211. In some examples, any of the core regions 1220 and/or clad regions 1230 can have a desired amount of diametric expansion or contraction. In some examples, this expansion or contraction can be used to enlarge or shrink the appearance of any decorations or designs disposed on one side of the plate 1211.

Any number or variety of electronic device components can include an optical component, as described herein. The process for forming such an optical component can include any combination of joining, bonding, co-forming, or fusing the regions together, as described herein. The optical component can include a flush external surface defined by the regions having different indices of refraction. Various examples of optical components as described herein, and processes for forming the same are described below with reference to FIGS. 11A-12.

Figure 11A:
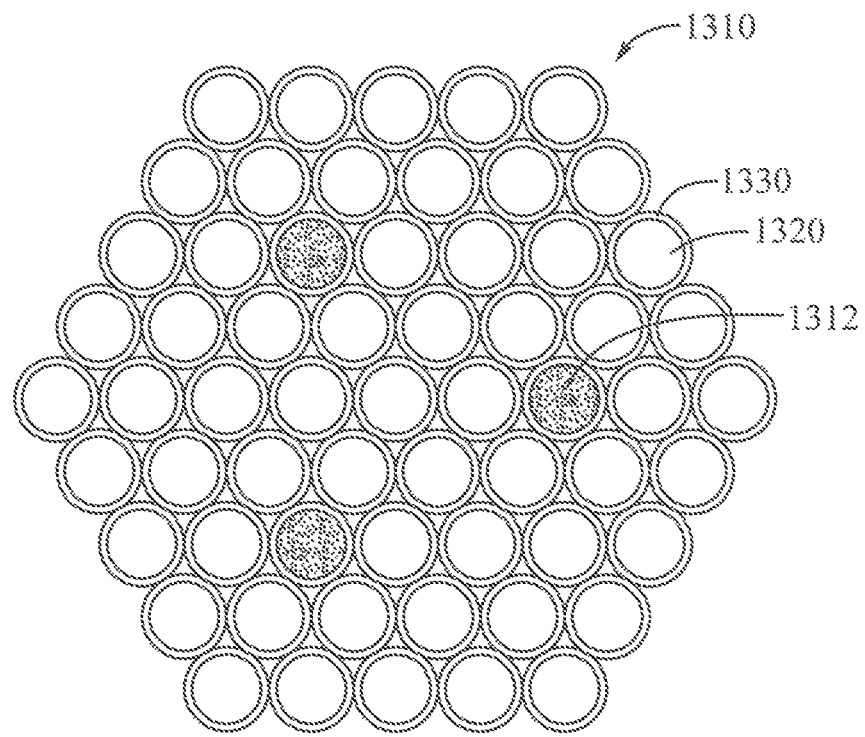
FIG. 11A shows a top view of a fiber optic plate.

FIG. 11A shows a top view of an optical component or plate 1310 that can be substantially similar to, and can include some or all of the features of the optical components described herein. In some examples, the plate 1310 can include an array of fibers and can be formed by one or more fusion drawing processes, as described herein. Thus, the plate 1310 can include an array of portions or regions of a first material or core 1320 having a first index of refraction, and a periphery of each of the portions of the first material 1320 can be surrounded by a second material or clad material 1330 that has a second index of refraction lower than the first index of refraction.

The arrangement of the core material 1320 and clad material 1330 of the plate 1310 can function as optical pixels, allowing light to be transmitted through the portions of the core material 1320, while also being isolated from light being transmitted through adjacent portions of the core material 1320. In some examples, and as described herein, the plate 1310 and portions of the core material 1320 can be positioned over one or more emitters and/or detectors to provide optical isolation. Further, in some examples, the core region of any of the desired fibers can include a light-absorbing material 1312 rather than the core material 1320. The light-absorbing material 1312 can be any of the light-absorbing materials described herein. The location of the light-absorbing material 1312 can be selected to block the transmission of light at desired locations on the plate 1310. These regions of light-absorbing material 1312 can serve to further increase isolation of light being transmitted through the plate 1310, to block regions of sensors or emitters, and/or any other desired purpose.

Figure 11B:
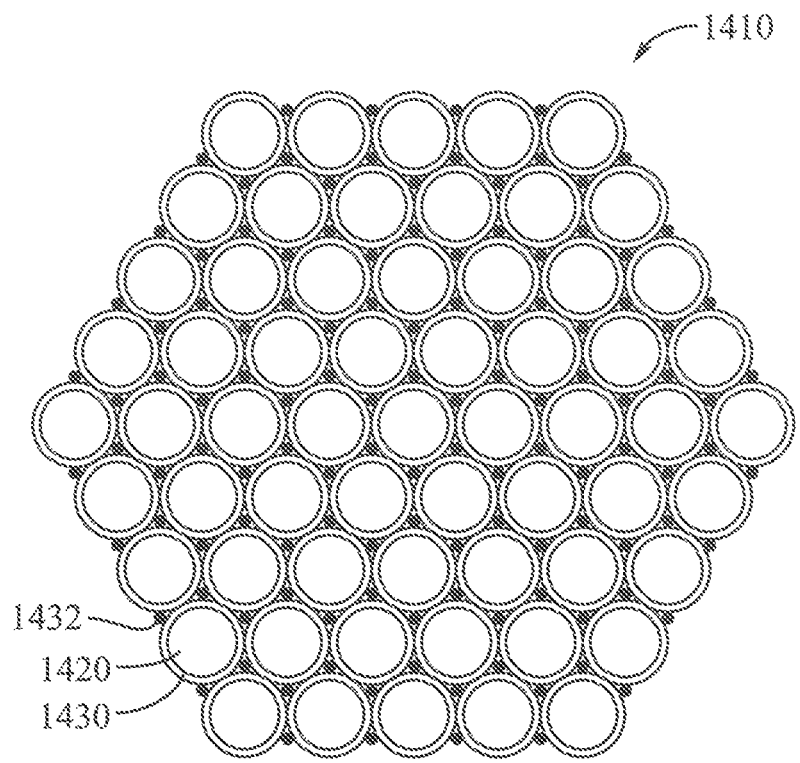
FIG. 11B shows a top view of a fiber optic plate.

FIG. 11B shows an example of another plate 1410 that can be substantially similar to, and can include some or all of the features of the optical components described herein. In some examples, the plate 1410 can include an array of fibers and can be formed by one or more fusion drawing processes, as described herein. Thus, the plate 1410 can include an array of portions or regions of a first material or core 1420 having a first index of refraction, and a periphery of each of the portions of the first material 1420 can be surrounded by a second material or a clad material 1430 that has a second index of refraction lower than the first index of refraction.

In some examples, the plate 1410 can include portions or regions of light-absorbing material 1432 interspersed or disposed between adjacent fibers. That is, the plate 1410 can include regions of light-absorbing material 1432 disposed adjacent to the clad material 1430 of adjacent fibers. In some examples, this light-absorbing material 1432 can be positioned at any number of locations or positions between adjacent fibers or clad portions 1430. As with the light-absorbing material 1312, the light-absorbing material 1432 can serve to further increase optical isolation between core portions 1420, or to provide any other desired function or purpose. In some examples, the composition of any of the components 1420, 1430, 1432 in component 1410, or any of the regions or portions of any of the components described herein can be positionally varied, as desired. For example, a portion of the first material 1420 near the center of the component 1410 can have a first concentration of a dopant, element, or constituent, while a portion of the first material 1420 nearer to the edge of the component 1410 can have a second, different concentration of a dopant, element, or constituent. In some examples, the dopant, element, or constituent can include an element or number of elements as desired, such as lithium, including materials added through chemical processes, ion exchange processes, and/or thermal processes. Additionally, some of the portions of material, such as material 1432, can be selected based on their thermal and/or structural properties, including the material's strength and/or CTE. In some examples, the portions containing the material 1432 can be chosen in order to achieve a desired stress distribution in the component 1410 and/or to locally strengthen one or more areas of the component 1410.

Figure 11C:
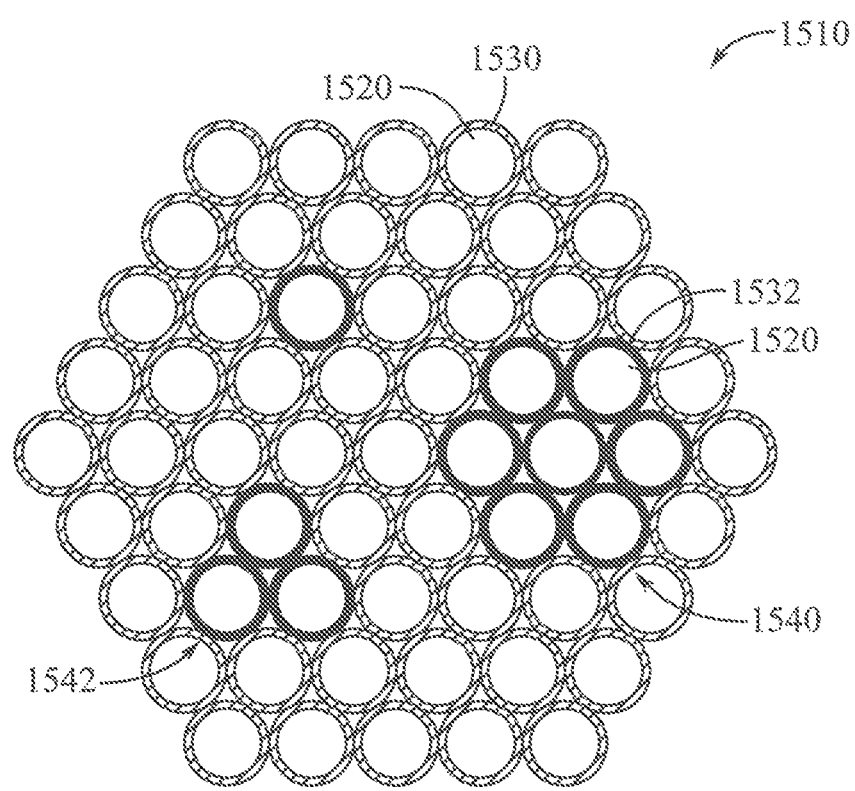
FIG. 11C shows a top view of a fiber optic plate.

FIG. 11C shows an example of another plate 1510 that can be substantially similar to, and can include some or all of the features of the optical components described herein. In some examples, the plate 1510 can include an array of fibers and can be formed by one or more fusion drawing processes, as described herein. Thus, the plate 1510 can include an array of portions or regions of a first material or core 1520 having a first index of refraction, and a periphery of each of the portions of the first material 1520 can be surrounded by a second material or clad material 1530 that has a second index of refraction lower than the first index of refraction. Whereas a light-absorbing material 1312 replaced any of the desired core regions 1320 of the plate 1310, in some examples, any number of desired clad portions 1530 of the plate 1510 can include a light-absorbing material 1532.

In some examples, the light-absorbing material 1532 can surround a periphery of multiple core regions 1520 disposed adjacent to one another to form a region 1540 that can have increased isolation as compared to other portions of the plate 1510. In some examples, the plate 1510 can include any number and size of these regions, including regions, such as region 1542, as shown. In addition to increasing the optical isolation, the light-absorbing material 1540 can be used to aid in the alignment of the plate 1510 during assembly or calibration of an electronic device including the plate 1510. For example, an optical detection system can identify and locate the light-absorbing material 1542, for example in the region 1540, and can use this as a guide to position the plate 1510 such that the region is located in a desired position relative to other components of an electronic device, for example, over a sensor or an emitter. Additionally, any of the features described in FIGS. 11A-11C can be included in any of the optical components described herein in any combination and configuration. Additional configurations are provided below with reference to FIG. 12.

Figure 12:
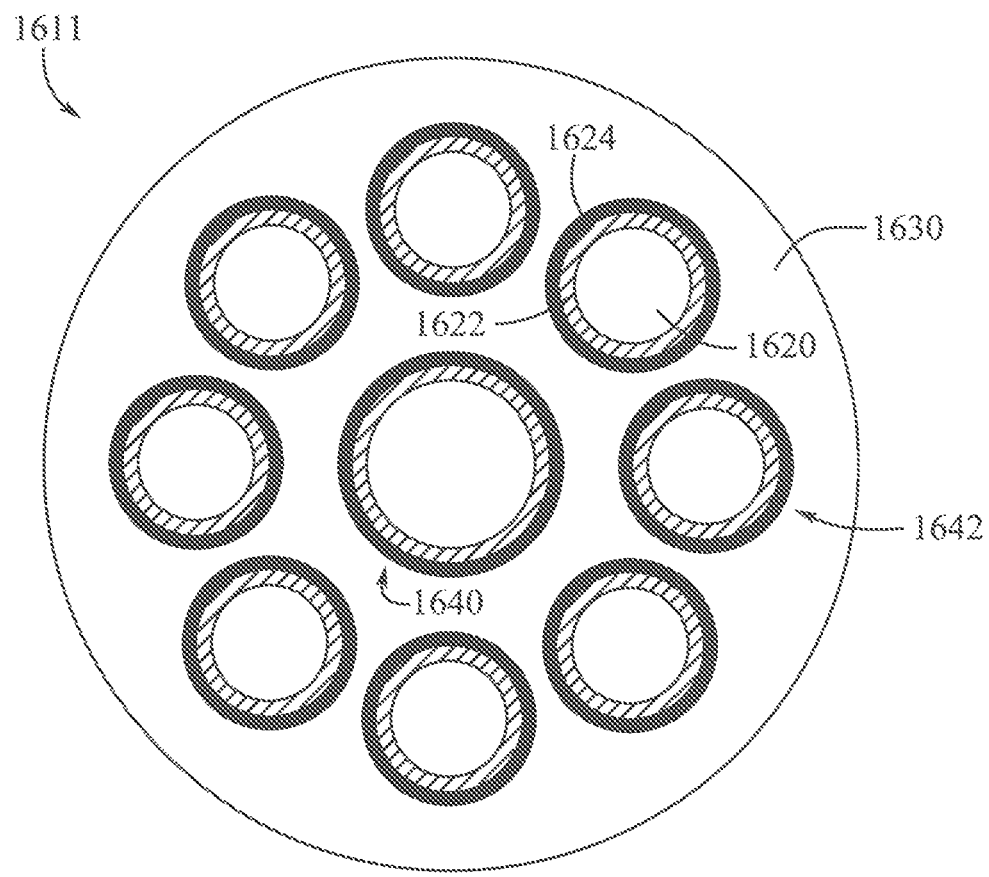
FIG. 12 shows a top view of an optical component.

FIG. 12 shows a top view of an optical component 1611 for an electronic device. In some examples, the optical component 1611 can be substantially similar to, and can include some or all of the features of the optical components described herein. The optical component 1611 can include multiple first or core regions 1620 including a first material having a first index of refraction. A periphery of one or more of the core regions 1620 can be surrounded by a clad second or clad region 1622 including second material having a second index of refraction that is lower than the first index of refraction, as described herein. A periphery of one of more of the clad regions 1622 can also be surrounded by a light-absorbing region including a light-absorbing material 1624, as described herein, such as an EMA glass. The core region 1620, clad region 1622, and light-absorbing region 1624 can be considered as a single portion or region 1642 of the optical component 1611.

In some examples, the optical component 1611 can include multiple of these regions 1640 arranged in any desired configuration, for example, spaced apart from one another. Additionally, the optical component can include a first region 1642 having a first set of dimensions and a second region 1640 spaced apart from the first region 1642, the second region 1640 having a second, different set of dimensions, such as a different peripheral area or shape. In some examples, a bulk region 1630 can surround a periphery of the regions 1640, 1642 to maintain the regions in a desired spatial relationship with one another. In some examples, the bulk region 1630 can include any desired material, including the materials of the regions 1620, 1622, 1624, as well as any other material. In some examples, some or all of the regions or materials of the optical component 1611 can be fused together so that the optical component 1611 is a unitary or monolithic body. In some examples, the optical component 1611 can be formed by one or more fusion drawing processes, as described herein.

In some examples, a core region 1620 of the optical component can have a width or a major dimension of from about 0.01 mm to about 10 mm, from about 0.1 mm to about 5 mm, from about 0.5 mm to about 3 mm, or from about 1 mm to about 3 mm. Additionally, an optical component 1611 including multiple core regions 1640, 1642 can have a separation distance between adjacent these regions of less than about 5 mm, less than about 3 mm, less than about 1 mm, less than about 0.5 mm, or even less than about 0.25 mm, or less. In some examples, a thickness of the clad region 1622 and/or light-absorbing region 1624 can be from about 0.01 mm to about 5 mm, from about 0.1 mm to about 3 mm, or from about 0.2 mm to about 1 mm, for example about 0.5 mm.

Similar to the description detailed above with reference to the examples shown in FIGS. 8A-8D, in the example of FIG. 12, any of the core regions 1640, 1642, including regions 1620, clad regions 1622, light absorbing regions/materials 1624, and bulk region 1630 of the component 1611, whether they be made of glass, sapphire, metal, ceramic, or any other material, can in some examples be adhered together using glue or one or more other adhesives. In at least one example, such an adhesive material can be a low index material relative to one or more adjacent or adhered regions and materials 1620, 1622, 1624, 1630 such that light transmitted through the core regions 1620 internally reflects off the boundary between the region and the adhesive layer to direct the transmission of light through the core regions 1620. Adhesive materials and glues can also be used to adhere multiple regions or portions of optical components described elsewhere herein and shown in the other figures.

In at least one example, light absorbing regions 1624 can include glue or other adhesive materials. In such an example, the index of refraction of the adhesive material is separated from the core region 1620 by the clad region 1622 such that the adhesive material may not contribute to the internal reflection of the core region 1620. Alternatively or additionally, in at least one example, the clad region 1622 can include a low index glue having an index of refraction about equal to the index of refraction of the core region 1620. Such an arrangement of adhesive materials and glue described with respect to the example shown in FIG. 12 can also be included in one or more other optical components described elsewhere herein and shown in the other figures.

As described with respect to FIGS. 13A-15B, each of the regions 1640, 1642 can be aligned with a light emitter, a light detector, a sensor, or any other component of the electronic device, as desired. Further, each of the regions 1640, 1642 can be sized to correspond to a size and/or shape of a light emitter, a light detector, a sensor, or any other component of the electronic device. Additional configurations for an optical component are provided below with reference to FIGS. 13A-13C.

Figure 13A:
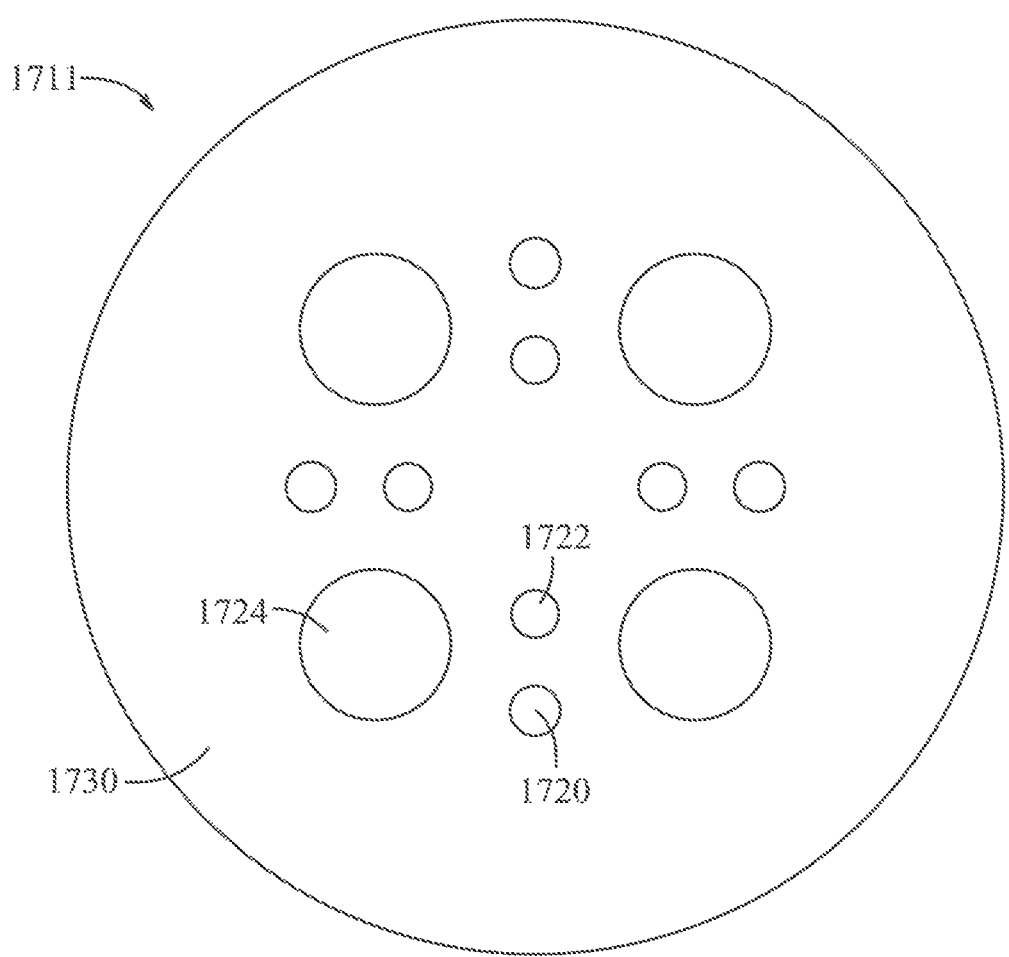
FIG. 13A shows a top view of an optical component.

FIG. 13A shows a top view of an optical component 1711 for an electronic device. The optical component 1711 can be substantially similar to, and can include some or all of the features of any of the optical components described herein, such as optical component 1611. In some examples, the optical component 1711 can include multiple first or core regions 1720, 1722, 1724 including a first material having a first index of refraction. In some examples, several core regions 1720, 1722 can have a first diameter or a major dimension and several other core regions 1724 can have a second, larger diameter or major dimension. Each of the core regions 1720, 1722, 1724 can be spaced apart from one another and a periphery of each of the core regions can be at least partially surrounded by a bulk region 1730 including a second material having a second index of refraction that is lower than the first index of refraction, as described herein. Although the optical component 1711 and regions 1720, 1722, 1724 are illustrated as having a circular peripheral shape, the optical component 1711 and regions 1720, 1722, 1724 can have substantially any desired peripheral shape.

The optical component 1711 can be included in an electronic device, such as a smartwatch, as described herein. In some examples, the optical component can be substantially similar to the optical component 111 described with respect to FIG. 2. That is, the optical component 1711 can be secured or affixed in an aperture defined by a housing of the electronic device that at least partially defines an internal volume. The optical component 1711 can at least partially define an external surface of the housing and/or the device. The optical component 1711 can be positioned such that one or more of the regions 1720, 1722, 1724 aligns with one or more components disposed in the internal volume.

Figure 13B:
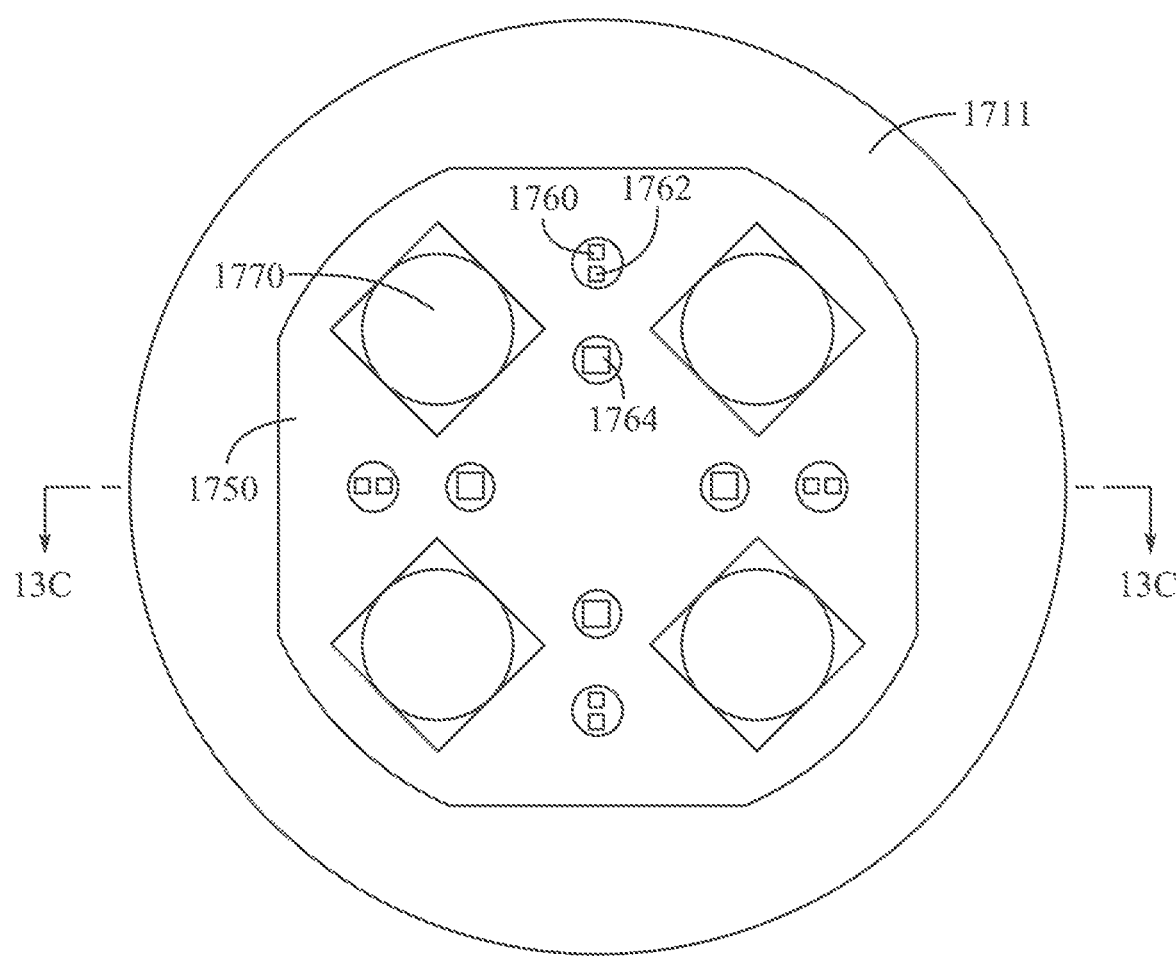
FIG. 13B shows a top view of an optical component, light emitters, and light detectors.

FIG. 13B shows a top view of the optical component 1711 positioned or aligned over several components, such as light emitters and light detectors, that can be disposed in the internal volume of an electronic device including the optical component. In some examples, the electronic device can include electromagnetic radiation, or light emitters 1760, 1762, 1764. In this example, two electromagnetic radiation emitters 1760, 1762 can be disposed below, or aligned with a single core region of the optical component 1711, while a single electromagnetic radiation emitter 1764 can be aligned with a second core region of the optical component 1711. In some examples, the electromagnetic radiation emitters can include LEDs that can emit one or more desired wavelengths of electromagnetic radiation or light. For example, the electromagnetic radiation emitter 1760 can emit red light, the electromagnetic radiation emitter 1762 can emit infrared light, and the electromagnetic radiation emitter 1764 can emit green light. By placing two different LEDs 1760, 1762 under the core region, the total internal reflection of the wavelengths of light from each LED 1760, 1762 within the core region can be homogenized when the light exits the optical component, thereby removing the need for an additional diffusing component and reducing a thickness of the optical component 1711.

The electronic device can also include one or more electromagnetic radiation detectors 1770 that are disposed in the internal volume and spaced apart from the electromagnetic radiation emitters 1760, 1762, 1764. In some examples, an electromagnetic radiation detector 1770 can detect any desired ranges of wavelengths of light, such as visible light, red light, green light, and/or infrared light. The electromagnetic radiation detector 1770 can have a larger functional area than the electromagnetic radiation emitters 1760, 1762, 1764 and thus can be disposed below the larger of the core regions 1724. The electromagnetic radiation detectors 1770 and the electromagnetic radiation emitters 1760, 1762, 1764 can be secured to, or disposed on, a mounting component 1750 as will be described further with respect to FIG. 13C.

Figure 13C:
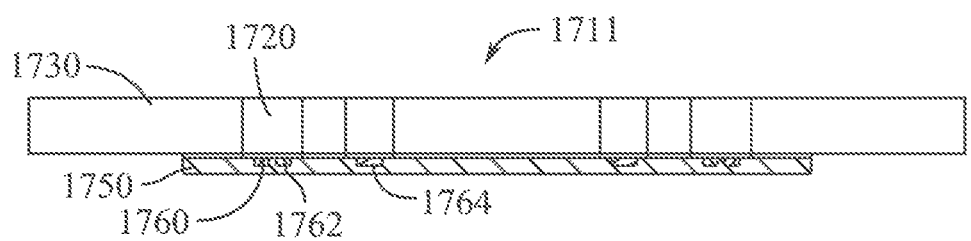
FIG. 13C shows a cross-sectional view of the optical component, light emitters, and light detectors of FIG. 13B.

FIG. 13C shows a cross-sectional view of the portion of the electronic device shown in FIG. 13B, including the optical component 1711, the mounting component 1750, and the electromagnetic radiation emitters 1760, 1762, 1764 mounted thereon. As can be seen, the mounting component can include a substantially planar portion that can have the electromagnetic radiation emitters 1760, 1762, 1764 mounted thereon, with one or more protrusions surrounding the electromagnetic radiation emitters 1760, 1762, 1764 to define cavities that include the electromagnetic radiation emitters 1760, 1762, 1764. The mounting component 1750, for example at the protrusions, can be directly attached or secured to the optical component 1711, as shown. The mounting component 1750 can be secured to the optical component 1711 by any method, such as adhesive or glue. By directly attaching the mounting component 1750 to the optical component 1711, the thickness of an assembly including the optical component 1711 and mounting component 1750 can be reduced, thereby allowing for a smaller device and/or for additional available space within the internal volume of the device.

As described herein, the optical component 1711 can allow for optical isolation of electromagnetic radiation emitted from the electromagnetic radiation emitters 1760, 1762, 1764 and from electromagnetic radiation entering the optical component through the core regions 1724 disposed over the electromagnetic radiation detectors 1770 without the need for potentially large or complicated physical isolation components. Thus, the optical component 1711 can allow for a larger functional area of components such as the electromagnetic radiation detector 1770, and/or for the inclusion of more electromagnetic radiation emitters 1760, 1762, 1764 and/or detectors 1770 because these components are able to transmit or receive light through a larger area of the optical component 1711 than would be achievable in a similar optical component including physical isolation features. Further details of optical components and their integration into electronic devices are described with respect to FIGS. 14A-14B and 15A-15B.

FIG. 14A shows a cross-sectional view of a portion of an electronic device as described herein, including an optical component 1811, a mounting component 1850, and electromagnetic radiation emitters 1860, 1862, 1864 mounted thereon. As can be seen, the mounting component can include a substantially planar portion that can have the electromagnetic radiation emitters 1860, 1862, 1864 mounted thereon, with one or more protrusions surrounding the electromagnetic radiation emitters 1860, 1862, 1864 to define cavities that include the electromagnetic radiation emitters 1860, 1862, 1864. The mounting component 1850, for example at the protrusions, can be directly attached or secured to the optical component 1811, as shown. The mounting component 1850 can be secured to the optical component 1811 by any method, such as adhesive or glue. By directly attaching the mounting component 1850 to the optical component 1811, the thickness of an assembly including the optical component 1811 and mounting component 1850 can be reduced, thereby allowing for a smaller device and/or allowing for additional available space within the internal volume of the device.

As described herein, the optical component 1811 can allow for optical isolation of electromagnetic radiation emitted from the electromagnetic radiation emitters 1860, 1862, 1864 and from electromagnetic radiation entering the optical component through the core regions 1824 disposed over the electromagnetic radiation detectors 1870 without the need for potentially large or complicated physical isolation components. Thus, the optical component 1811 can allow for a larger functional area of components such as the electromagnetic radiation detector 1870, and/or for the inclusion of more electromagnetic radiation emitters 1860, 1862, 1864 and/or detectors 1870 because these components are able to transmit or receive light through a larger area of the optical component 1811 than would be achievable in a similar optical component including physical isolation features.

Additionally, the optical component 1811 can include core regions 1820, 1821 having a first index of a refraction and a clad regions 1822, 1823 surrounding these core regions. The clad regions can have a second, different index of refraction, as described herein, such as a lower index of refraction. In some examples, one or more of the core regions 1820 and its associated clad region 1822 can have a curved, bent, or non-linear shape, as shown. That is, the portion of the core region 1820 defining the exterior surface of the optical component 1811 can be laterally offset from the portion of the core region 1820 defining the interior surface of the optical component 1811. In this way, light emitted from the emitters 1860, 1862 can be directed to a desired location upon exit from the optical component 1811. Further details regarding non-linear core regions are described with respect to FIG. 14B.

FIG. 14B shows a cross-sectional view of a portion of the optical component 1811, light emitters 1860, 1862, and light detector 1864 of FIG. 14A. In some examples, it can be desirable for the distance D2 between the area of the optical component 1811 where light is emitted (the core region 1820) and the area where it is collected (the core region 1821) to be as large as possible. In some use cases, this can allow for a larger area of substrate 1802 to be sampled by a sensor system including the emitters 1860, 1862 and detector 1864. For example, the substrate 1802 can be a user's skin and the emitters 1860, 1862 and detector 1864 can be used to measure biometric information of the user. In some such use cases, it can be desirable to sample as large an area of skin as possible in order to reduce noise and provide reliable biometric information.

It can also be desirable, however, to minimize the size of an electronic device including emitters 1860, 1862 and detector 1864, and to have the emitters 1860, 1862 and detector 1864 packed as closely together as possible in order to provide room for other components or a smaller device housing. That is, it can be desirable to minimize the distance D1 between the emitters 1860, 1862 and the detector 1864. Accordingly, one way to optimize both of these variable is to have an optical component 1811 that includes a bent or non-linear core region 1820 which can direct light emitted by the emitters 1860, 1862 laterally away from the detector 1864 in order to increase the distance D2 while maintaining a relatively small separation distance D1. In some example, the non-linear core region 1820 can include one, two, or three or more bends or bend regions. In some examples, these bend regions can have a bend radius of up to about 0.1 mm, 0.5 mm, or even 1 mm or more. Further, the clad region 1822 associated with the core region 1820 can also have a similar or identical architecture. In some examples, the bend angle can be up to 15 degrees, up to 30 degrees, or up to 45 degrees. An optical component 1811 including a non-linear core region 1820 can be formed by any of the processes described herein, including drawing and fusion, and/or by molding a bulk material 1830 around a non-linear core region 1820 and fusing or otherwise joining the regions 1830, 1822, 1820.

FIG. 15A shows a cross-sectional view of a portion of an electronic device, as described herein, including an optical component 1911, a mounting component 1950, and electromagnetic radiation emitters 1960, 1962, 1964 mounted thereon. As can be seen, the mounting component can include a substantially planar portion that can have the electromagnetic radiation emitters 1960, 1962, 1964 mounted thereon, with one or more protrusions surrounding the electromagnetic radiation emitters 1960, 1962, 1964 to define cavities that include the electromagnetic radiation emitters 1960, 1962, 1964. The mounting component 1950, for example at the protrusions, can be directly attached or secured to the optical component 1911, as shown. The mounting component 1950 can be secured to the optical component 1911 by any method, such as adhesive or glue. By directly attaching the mounting component 1950 to the optical component 1911, the thickness of an assembly including the optical component 1911 and mounting component 1950 can be reduced, thereby allowing for a smaller device and/or for additional available space within the internal volume of the device.

FIG. 15B shows a cross-sectional view of a portion of the optical component 1911, light emitters 1960, 1962, and light detector 1964 of FIG. 15A. As described with respect to FIG. 14B, it can be desirable in some use cases for a sensor system including light emitters 1960, 1962, and light detector 1964 to sample as large an area of a substrate 1902 as possible. For example, when the substrate 1902 is a user, it can be desirable to sample a large area of the user's skin in order to collect biometric information using a sensor system that includes light emitters 1960, 1962, and light detector 1964. Whereas the optical component 1811 of FIGS. 14A and 14B achieved this aim by increasing the separation distance D2, in some examples, an optical component 1911 can provide a larger area or spot size for light emitted from the emitters 1960, 1962 and exiting the core region 1920. That is, the radius R2 of the spot of light emitted from the optical component 1911 can be larger than the spacing or radius of light R1 generated by the emitters 1860, 1862. In some examples, this increased spot size can be achieved with an angled or diverging core region 1920 that can include non-parallel, angled, or diverging sidewalls, as shown. In some examples, the sidewalls can be angled relative to the interior and/or exterior surface of the core region up to about 15 degrees, up to about 30 degrees, or even up to about 45 degrees. The optical component 1911 can include other core region 1921 that may not be angle or diverging, or that may diverge at different angles as desired. In some examples, an optical component 1911 including a diverging core region 1920 can be formed by any of the processes described herein including drawing and fusion, by molding a bulk material 1830 around a diverging core region 1920 and fusing or otherwise joining the regions and/or by gluing or bonding the diverging core region 1920 into a space defined by the bulk region 1930. Further details of optical components are described with respect to FIG. 16A-16C.

Figure 16A:
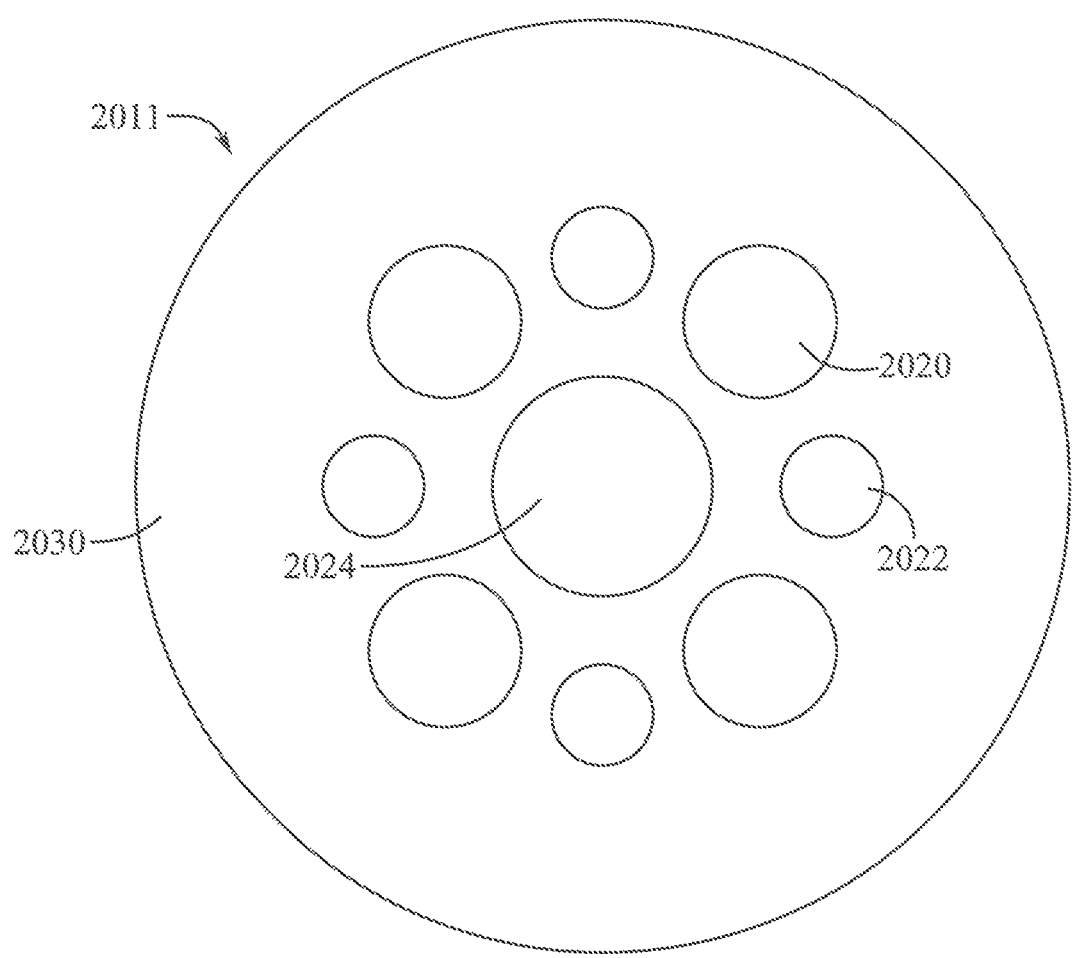
FIG. 16A shows a top view of an optical component.

FIG. 16A shows a top view of an optical component 2011 for an electronic device. The optical component 2011 can be substantially similar to, and can include some or all of the features of any of the optical components described herein, such as optical components 1611, 1711. In some examples, the optical component 2011 can include multiple first or core regions 2020, 2022, 2024 including a first material having a first index of refraction. In some examples, these core regions 2020, 2022, 2024 can have different diameters or major dimensions. Each of the core regions 2020, 2022, 2024 can be spaced apart from one another and a periphery of each of the core regions 2020, 2022, 2024 can be at least partially surrounded by a bulk region 2030 including a second material having a second index of refraction that is lower than the first index of refraction, as described herein. Although the optical component 2011 and regions 2020, 2022, 2024 are illustrated as having a circular peripheral shape, the optical component 2011 and regions 2020, 2022, 2024 can have substantially any desired peripheral shape.

The optical component 2011 can be included in an electronic device, such as a smartwatch, as described herein. In some examples, the optical component can be substantially similar to the optical component 111 described with respect to FIG. 2. That is, the optical component 2011 can be secured or affixed in an aperture defined by a housing of the electronic device that at least partially defines an internal volume. The optical component 2011 can at least partially define an external surface of the housing and/or the device. The optical component 2011 can be positioned such that one or more of the regions 2020, 2022, 2024 aligns with one or more components disposed in the internal volume.

Figure 16B:
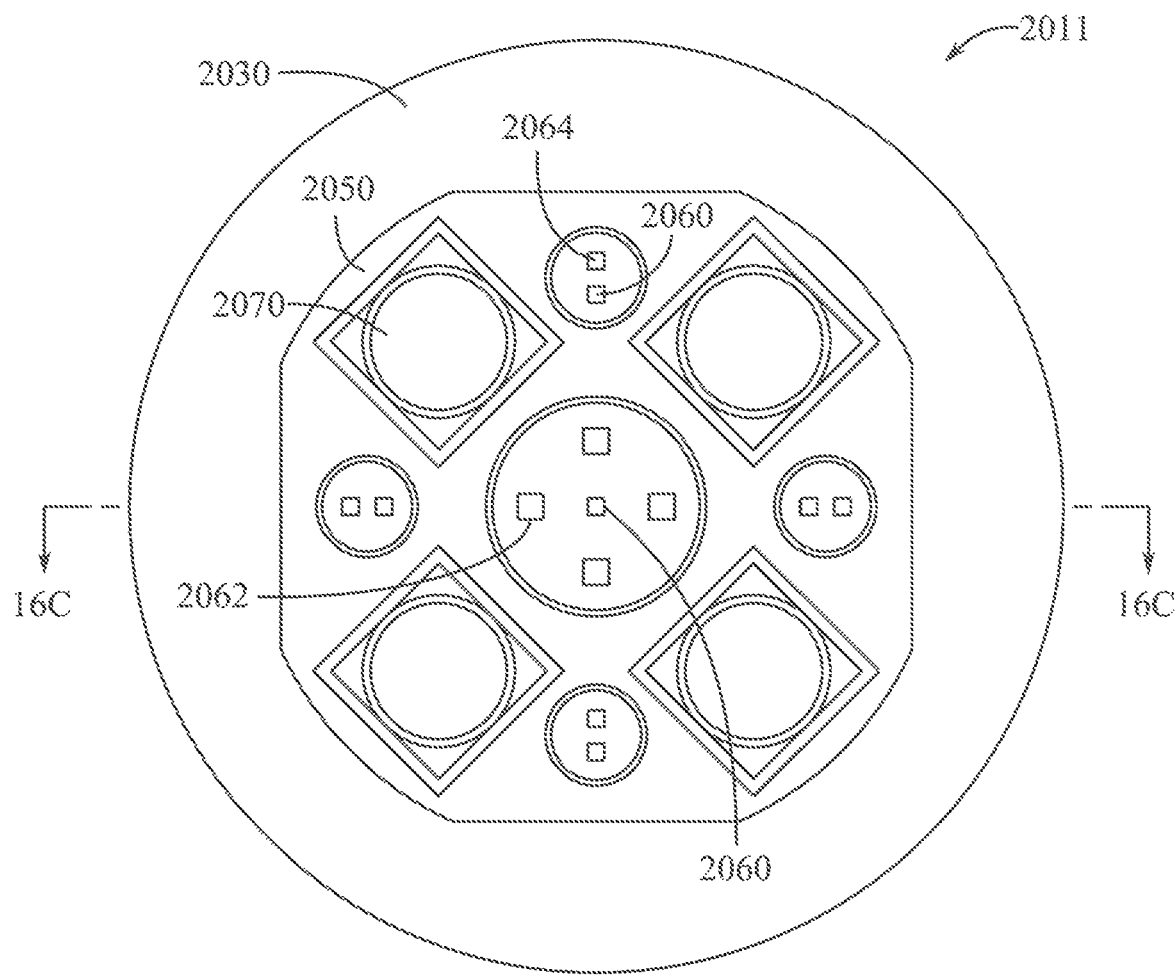
FIG. 16B shows a top view of an optical component, light emitters, and light detectors.

FIG. 16B shows a top view of the optical component 2011 positioned or aligned over several components, such as light emitters and light detectors, that can be disposed in the internal volume of an electronic device including the optical component. In some examples, the electronic device can include electromagnetic radiation, or light emitters 2060, 2062, 2064. In this example, two electromagnetic radiation emitters 2060, 2064 can be disposed below, or aligned with a single core region of the optical component 2011, while multiple other electromagnetic radiation emitters, for example, five electromagnetic radiation emitters, including one electromagnetic radiation emitter 2060 and four electromagnetic radiation emitters 2062 can be aligned with a second core region of the optical component 2011. In some examples, the electromagnetic radiation emitters can include LEDs that can emit one or more desired wavelengths of electromagnetic radiation or light. For example, the electromagnetic radiation emitter 2060 can emit infrared light, the electromagnetic radiation emitter 2062 can emit green light, and the electromagnetic radiation emitter 2064 can emit red light. By placing two different LEDs 2060, 2064, or 2060, 2062 under a core region, the total internal reflection of the wavelengths of light from each LED 2060, 2062 within the core region can be homogenized when the light exits the optical component, thereby removing the need for an additional diffusing component and reducing a thickness of the optical component 2011.

The electronic device can also include one or more electromagnetic radiation detectors 2070 that are disposed in the internal volume and spaced apart from the electromagnetic radiation emitters 2060, 2062, 2064. In some examples, an electromagnetic radiation detector 2070 can detect any desired ranges of wavelengths of light, such as visible light, red light, green light, and/or infrared light. The electromagnetic radiation detectors 2070 and the electromagnetic radiation emitters 2060, 2062, 2064 can be secured to or disposed on a mounting component 2050 as will be described further with respect to FIG. 16C.

Figure 16C:
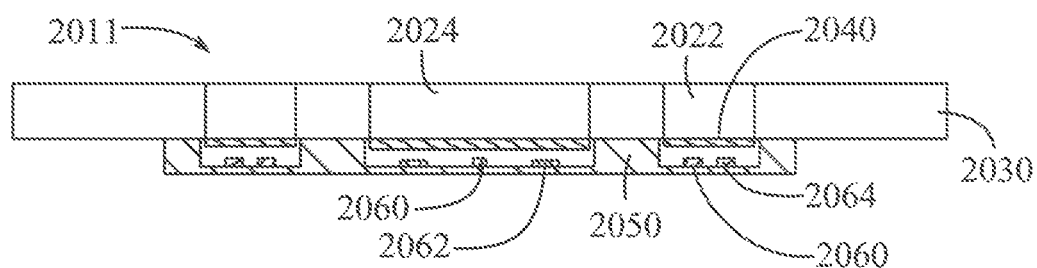
FIG. 16C shows a cross-sectional view of the optical component, light emitters, and light detectors of FIG. 16B.

FIG. 16C shows a cross-sectional view of the portion of the electronic device shown in FIG. 16B, including the optical component 2011, the mounting component 2050, and the electromagnetic radiation emitters 2060, 2062, 2064 mounted thereon. As can be seen, the mounting component can include a substantially planar portion that can have the electromagnetic radiation emitters 2060, 2062, 2064 mounted thereon, with one or more protrusions at least partially surrounding the electromagnetic radiation emitters 2060, 2062, 2064 to define cavities that include the electromagnetic radiation emitters 2060, 2062, 2064. The mounting component 2050, for example at the protrusions, can be directly attached or secured to the optical component 2011, as shown. The mounting component 2050 can be secured to the optical component 2011 by any desired method, such as by an adhesive or glue.

In some examples, a component or coating 2040 can be disposed on a surface of one or more of the core regions 2020, 2022, 2024. In some examples, the component 2040 can be disposed on an interior surface of the core regions 2020, 2022, 2024. Accordingly, light emitted from the electromagnetic radiation emitters 2060, 2062, 2064 can pass through the component 2040 prior to entering a core region 2020, 2022, 2024. Thus, in some examples, the component 2040 can act as diffuser for light emitted from the electromagnetic radiation emitters 2060, 2062, 2064. For example, the component 2040 can cause light emitted from the electromagnetic radiation emitters 2060 and 2064 to mix or combine to a desired degree. In some examples, the component 2040 can include a diffuser or lens, including a Fresnel lens or a micro lens array. In some examples, the component 2040 can include a ceramic and/or polymer coating. Further details regarding optical components and the mixing of signals or radiation emitted from electromagnetic radiation emitters are described with respect to FIGS. 17A-17D.

Figure 17A:
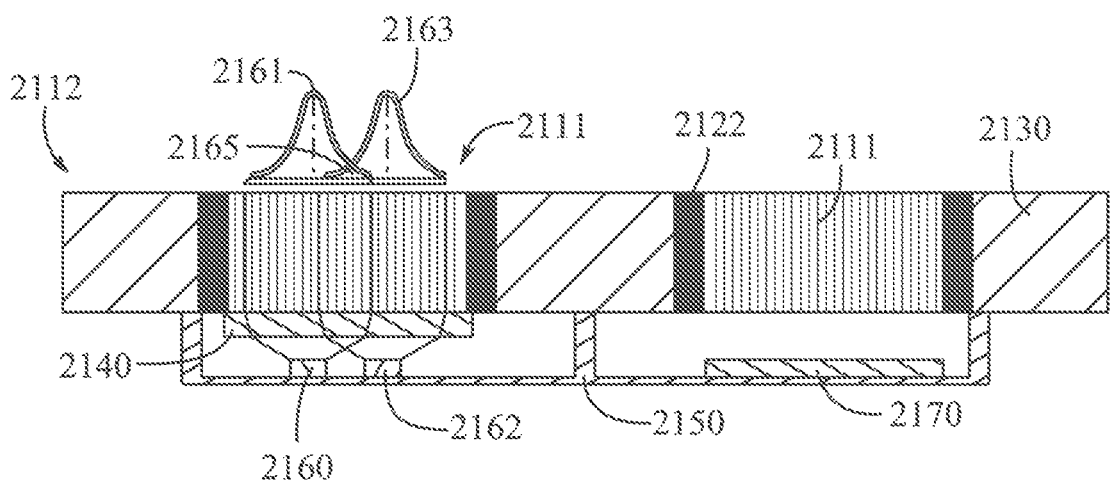
FIG. 17A shows a cross-sectional view of an optical component, light emitters, and a light detector.

FIG. 17A shows a cross-sectional view of a portion of an electronic device as described herein, including an optical component 2112, a mounting component 2150, electromagnetic radiation emitters 2160, 2162, and an electromagnetic radiation detector 2170. In this example, the optical component 2112 includes region 2111 including an array of core portions of a first material having a first index of refraction, with a periphery of each of the core portions of the first material surrounded by a clad region including a second material having a second index of refraction that is lower than the first index of refraction. In some examples, a periphery of each of these array regions 2111 can be surrounded by a third material 2122, for example a light-absorbing material such as an EMA glass. As with other optical components described herein, a periphery of a region 2111 and/or light-absorbing material 2122 can be at least partially surrounded by a bulk region 2130. The bulk region 2130 can include any desired material, including the materials of the region 2111 or 2122.

In some examples, a diffusing component 2140, such as a Fresnel lens or micro lens array, can be disposed on an interior surface of the region 2111 opposite the electromagnetic radiation emitters 2160, 2162. As described herein, the fiber array construction of the region 2111 can provide optical isolation between the radiation or light emitted from each of the electromagnetic radiation emitters 2160, 2162. The intensity of these light signals as emitted from the region 2111 is represented by the curves 2161, 2163 illustrated in FIG. 17A, with the graph 2161 corresponding to light emitted by the electromagnetic radiation emitter 2160 and graph 2163 corresponding to light emitted by the electromagnetic radiation emitter 2162. As can be seen, some mixing or overlap of the signals can occur as the light travels through the component 2140, here represented by region 2165, but the peaks of the signals 2161, 2163 remain relatively separated as they are emitted from the optical component 2112.

In some examples, the amount of mixing or overlap of these signals can be controlled by controlling the optical properties of the component 2140 in order to achieve a desired level of signal overlap. In some examples, light emitted by the electromagnetic radiation emitters 2160, 2162 can include different wavelengths and can have different path length requirements based on the intended function of each electromagnetic radiation emitter 2160, 2162 and any associated electromagnetic radiation detectors 2170. Accordingly, in some examples, an amount of separation between the signals 2161, 2163 can be desirable. Further, the separation or isolation provided by the region 2111 can allow the electromagnetic radiation emitters 2160, 2162 to be positioned closer to one another than would otherwise be allowed given a desired amount of signal separation. For example, the electromagnetic radiation emitters 2160, 2162 can be positioned within 2 mm of one another, within 1 mm of one another, or even within 0.5 mm or less of one another.

Figure 17B:
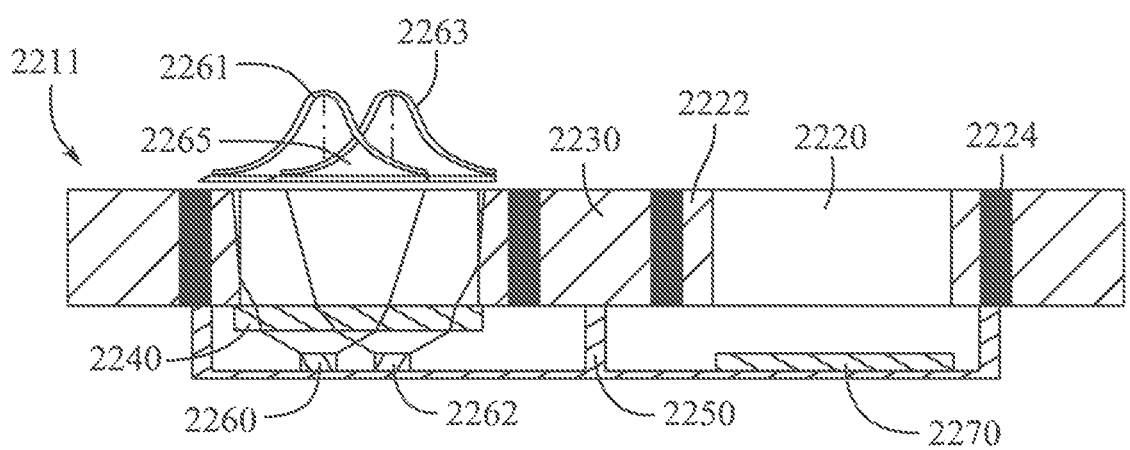
FIG. 17B shows a cross-sectional view of an optical component, light emitters, and a light detector.

FIG. 17B shows a cross-sectional view of a portion of an electronic device as described herein, including an optical component 2211, a mounting component 2250, electromagnetic radiation emitters 2260, 2262, and an electromagnetic radiation detector 2270. In this example, the optical component 2211 includes core regions 2220 including a first material having a first index of refraction, with a periphery of each of the core regions 2220 surrounded by a clad region 2222 including a second material having a second, lower index of refraction and a light-absorbing material 2224. A periphery of the core regions 2220, clad regions 2222, and/or light-absorbing regions 2224 can be surrounded by a bulk material 2230, as described herein.

In this examples, the intensity of radiation or light signals emitted from the electromagnetic radiation emitters 2260, 2262 are represented with graphs 2261, 2263, respectively. As can be seen, the singular core region 2220 can provide for a higher degree of signal mixing or overlap 2265 than the example described in FIG. 17A. A component 2240 can also optionally be positioned on a surface of the core region 2220 to further increase or decrease a desired amount of mixing or overlap. In some examples, however, a desired amount of mixing can be achieved without the component 2240, and the elimination of component 2240 can result in increased space savings in the device.

Figure 17C:
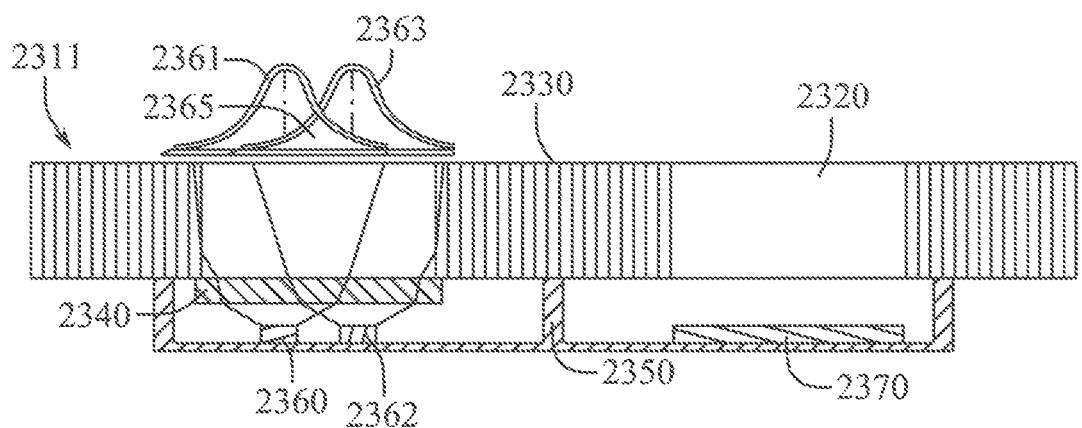
FIG. 17C shows a cross-sectional view of an optical component, light emitters, and a light detector.

FIG. 17C shows a cross-sectional view of a portion of an electronic device, as described herein, including an optical component 2311, a mounting component 2350, electromagnetic radiation emitters 2360, 2362, and an electromagnetic radiation detector 2370. In this example, the optical component 2311 includes core regions 2320 including a first material having a first index of refraction. A periphery of the core regions 2320 can be surrounded by a bulk material 2330, as described herein. In this particular example, the bulk material 2330 can include an array of core portions of a first material having a first index of refraction, with a periphery of each of the core portions of the first material surrounded by a clad region including a second material having a second index of refraction that is lower than the first index of refraction.

Figure 17D:
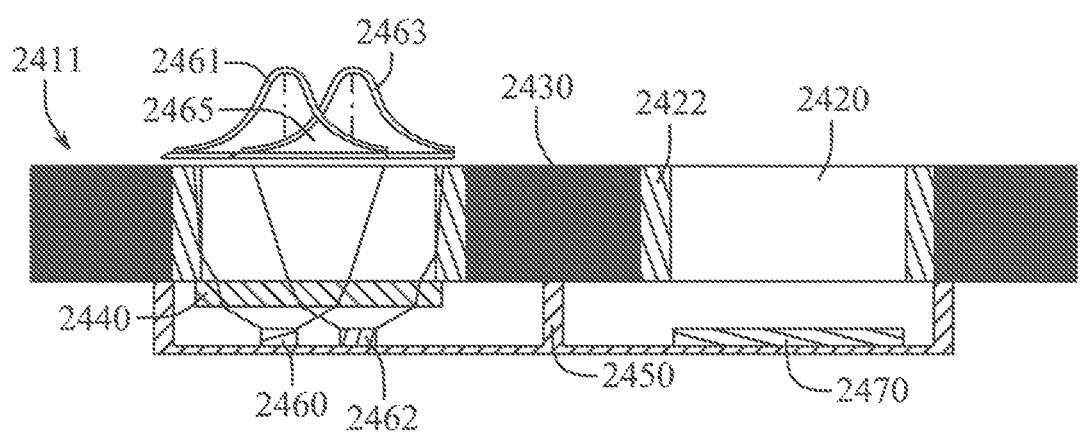
FIG. 17D shows a cross-sectional view of an optical component, light emitters, and a light detector.

FIG. 17D shows a cross-sectional view of a portion of an electronic device as described herein, including an optical component 2411, a mounting component 2450, electromagnetic radiation emitters 2460, 2462, and an electromagnetic radiation detector 2470. In this example, the optical component 2411 includes core regions 2420 including a first material having a first index of refraction. A periphery of the core regions 2420 can be surrounded by a bulk material 2430, as described herein. In this particular example, the bulk material 2430 can include a material having a second index of refraction less than the first index of refraction. In some examples, the bulk material 2430 can also include a light-absorbing pigment therein. For example, the bulk material 2430 can include a light-absorbing material, such as any of the light-absorbing materials described herein, including extra-mural absorption glass or ceramic material.

Any number or variety of electronic device components can include an optical component, as described herein. The process for forming such an optical component can include any combination of joining, bonding, co-forming, or fusing the regions together, as described herein. The optical component can include a flush external surface defined by the regions having different indices of refraction. Various examples of optical components as described herein, and processes for forming the same are described below with reference to FIGS. 18A-18B.

Figure 18A:
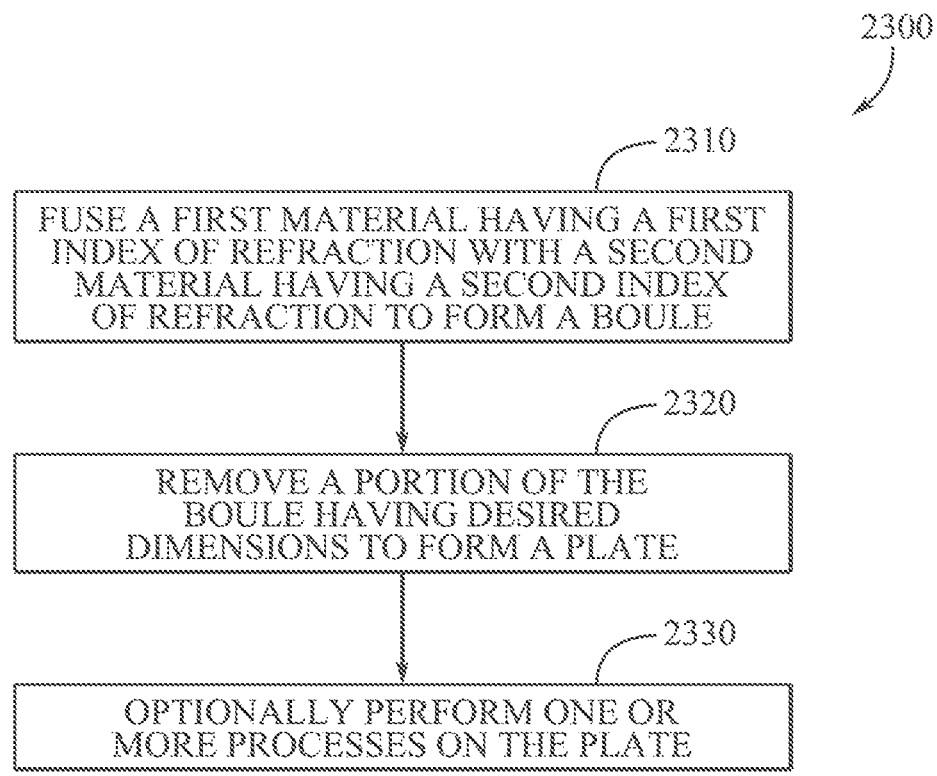
FIG. 18A shows a process flow diagram for a method of forming an optical component.

FIG. 18A shows a process flow diagram for a method 2300 of forming an optical component, as described herein. The process 2300 can include fusing a first material having a first index of refraction with a second material having a second index of refraction to form a boule at block 2310, removing a portion of the boule having desired dimensions to form a plate at block 2320, and optionally performing one or more processes on the plate at block 2330.

At block 2310, a first material having a first index of refraction is fused with a second material having a second index of refraction to form a boule. In some examples, as described herein, the second index of refraction can be lower than the first index of refraction. In some examples, the materials can be fused by any desired process, including a fusion drawing process, a casting process, a sintering process, a pressing process, and/or any other process or processes, as desired. In some examples, a difference between the index of refraction of the first material and the second material can be between 0 and 0.7, for example, about 0.2, 0.25, or 0.3. The first material can include any of the materials described herein, for example any of the core materials described with respect to FIGS. 8A-9C. Similarly, the second material can include any of the materials described herein, for example any of the clad materials described with respect to FIGS. 8A-9C. In some examples, as described with respect to FIG. 9B, block 2310 can be performed any number of times before the actions of block 2320 are carried out.

At block 2320, a portion of the boule having desired dimensions is removed to form a plate. In some examples, multiple portions having desired dimensions can be removed from a single boule. The plate can be removed by any process or processes as desired, such as machining, cutting, and/or laser cutting. In some examples, the plate can be removed and/or subjected to further subtractive processing so that it can have substantially any desired peripheral shape. In some examples, multiple plates having different dimensions and/or orientations can be removed from the same boule. For example, a plate can be removed such that certain regions of the first material and/or second material are in desired locations with respect to the periphery of the plate.

At block 2330, one or more additional processes can optionally be performed on the plate. In some examples, such processes can include forming one or more coatings on one or more surfaces of the plate. For example, one or more anti-reflective coatings, scratch resistant coatings, or any other desired coatings, as described with respect to FIG. 10A. In some examples, such processes can include chemically strengthening one or more regions of the first material and/or second material. That is, the plate can be subjected to one or more chemical processes, such as one or more ion exchange process. In some examples, the plate can be subjected to one or more thermal processes, such as one or more annealing processes.

In some examples, the plate can be subjected to a ceraming process. That is, a glass material of the plate can be subjected to a process that can at least partially crystalize the material. Thus, in some examples, the plate can include a glass material that can be a nucleating glass. In some examples, one or more of the processes carried out on the plate can change the index of refraction of any of the portions of the plate, as desired. Additionally, although described as occurring on a formed plate, the process or processes at block 2330 can be carried out at any time during the process 2300, including prior to, during, and/or after any of the blocks or steps described herein. In some examples, block 2330 can include depositing one or more ion exchange media one a desired portion or portions of the plate. In some examples, the desired ion exchange media can be deposited by a screen printing process, or any other desired deposition process. In some examples, an ion exchange process of block 2330 can include a solid state and/or liquid state ion exchange process. Further details of processes for forming optical components are described below with respect to FIG. 18B.

Figure 18B:
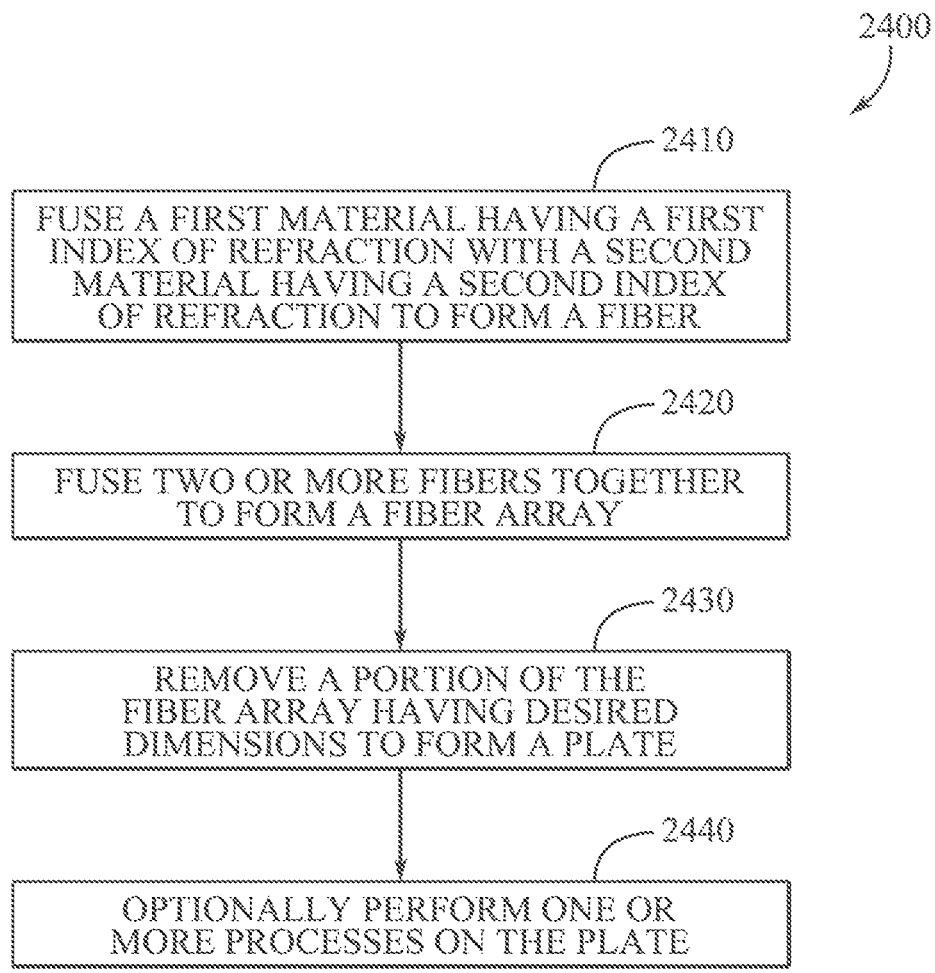
FIG. 18B shows a process flow diagram for a method of forming an optical component.

FIG. 18B shows a process flow diagram for a method 2400 of forming an optical component, as described herein. The process 2400 can include fusing a first material having a first index of refraction with a second material having a second index of refraction to form a fiber at block 2410, fusing two or more fibers together to form a fiber array at block 2420, removing a portion of the fiber array having desired dimensions to form a plate at block 2430, and optionally performing one or more processes on the plate at block 2440.

At block 2410, a first material having a first index of refraction is fused with a second material having a second index of refraction to form a fiber. In some examples, the materials can be fused by any desired process, including a fusion drawing process. In some examples, as described herein, the second index of refraction can be lower than the first index of refraction. In some examples, a difference between the index of refraction of the first material and the second material can be between 0 and 0.7, for example, about 0.2, 0.25, or 0.3. The first material can include any of the materials described herein, for example, any of the core materials described with respect to FIGS. 8A-9C. Similarly, the second material can include any of the materials described herein, for example any of the clad materials described with respect to FIGS. 8A-9C. In some examples, block 2410 can be repeated any number of times and can form any number of fibers.

At block 2420, two or more fibers formed at block 2410 can be fused to form a fiber array as described with respect to FIG. 9B. In some examples, the fibers can be fused by any desired process, including a fusion drawing process. In some examples, as described with respect to FIG. 9B, block 2410 can be performed any number of times before the actions of any other blocks are carried out.

At block 2430, a portion of the fiber array having desired dimensions is removed to form a plate. In some examples, multiple portions having desired dimensions can be removed from a single fiber array. The plate can be removed by any desired process or processes, such as machining, cutting, and/or laser cutting. In some examples, the plate can be removed and/or subjected to further subtractive processing so that it can have substantially any desired peripheral shape. In some examples, multiple plates having different dimensions and/or orientations can be removed from the same fiber array. For example, a plate can be removed such that certain regions of the first material and/or second material are in desired locations with respect to the periphery of the plate.

At block 2440, one or more additional processes can optionally be performed on the plate. In some examples, such processes can include forming one or more coatings on one or more surfaces of the plate. For example, one or more anti-reflective coatings, scratch resistant coatings, or any other desired coatings as described with respect to FIG. 10A. In some examples, such processes can include chemically strengthening one or more regions of the first material and/or second material. That is, the plate can be subjected to one or more chemical processes, such as one or more ion exchange process. In some examples, the plate can be subjected to one or thermal processes, such as one or more annealing processes.

Any of the features or aspects of the components discussed herein can be combined or included in any varied combination. For example, the design and shape of the optical components are not limited in any way and can be formed by any number of processes, including those discussed herein. A component including two or more portions having different indices of refraction, as discussed herein, can be or can form all or a portion of a component, such as a housing or enclosure, for an electronic device. The component can also be or form any number of additional components of an electronic device, including internal components, external components, cases, surfaces, or partial surfaces.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates examples in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

As used herein, the terms exterior, outer, interior, inner, top, and bottom are used for reference purposes only. An exterior or outer portion of a component can form a portion of an exterior surface of the component but may not necessarily form the entire exterior of outer surface thereof. Similarly, the interior or inner portion of a component can form or define an interior or inner portion of the component but can also form or define a portion of an exterior or outer surface of the component. A top portion of a component can be located above a bottom portion in some orientations of the component, but can also be located in line with, below, or in other spatial relationships with the bottom portion depending on the orientation of the component.

Various inventions have been described herein with reference to certain specific embodiments and examples. However, they will be recognized by those skilled in the art that many variations are possible without departing from the scope and spirit of the inventions disclosed herein, in that those inventions set forth in the claims below are intended to cover all variations and modifications of the inventions disclosed without departing from the spirit of the inventions. The terms "including:" and "having" come as used in the specification and claims shall have the same meaning as the term "comprising."

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An electronic device, comprising:
    a housing defining an aperture and at least partially defining an internal volume;
    an electromagnetic radiation emitter disposed in the internal volume;

an electromagnetic radiation detector disposed in the internal volume; and an optical component disposed in the aperture and at least partially defining an external surface of the electronic device, the optical component comprising:
- a first region comprising a first material having a first index of refraction, the first region aligned with the electromagnetic radiation emitter;
- a second region comprising the first material, the second region aligned with the electromagnetic radiation detector; and
- a bulk region at least partially surrounding a periphery of the first region and a periphery of the second region, the bulk region comprising a second material having a second index of refraction that is lower than the first index of refraction; wherein:

the electromagnetic radiation emitter and the electromagnetic radiation detector are disposed on a mounting component; and the mounting component is directly attached to the optical component.

2. The electronic device of claim 1, wherein:
the bulk region surrounds an entire periphery of the first region;
the electromagnetic radiation emitter comprises a first electromagnetic radiation emitter that emits a first range of wavelengths of light; and
the electronic device further comprises a second electromagnetic radiation emitter that emits a second range of wavelengths of light different from the first range of wavelengths of light, the second electromagnetic radiation emitter aligned with the first region.

3. The electronic device of claim 1, wherein the first region further comprises a third material surrounding a periphery of a portion of the first region, the third material having a third index of refraction that is lower than the first index of refraction.

4. The electronic device of claim 3, wherein:
the first region further comprises an array of fibers comprising the first material; and
a periphery of each fiber is surrounded by the third material.

5. The electronic device of claim 1, wherein the optical component further comprises an antireflective coating.

6. The electronic device of claim 1, wherein the first region is chemically strengthened.

7. The electronic device of claim 1, wherein the second index of refraction is at least 0.2 lower than the first index of refraction.

8. An optical component for an electronic device, comprising:
a first transmission portion comprising a first region comprising a first material having a first index of refraction, a periphery of the first region surrounded by a second region comprising a second material having a second index of refraction that is lower than the first index of refraction, and a periphery of the second region surrounded by a third region;
a second transmission portion comprising a fourth region comprising the first material, the second transmission portion spaced apart from the first transmission portion, a periphery of the fourth region surrounded by a fifth region comprising the second material, and a periphery of the fifth region surrounded by a sixth region; and
a bulk portion at least partially surrounding the periphery of the first transmission portion and the periphery of the second transmission portion, the first transmission portion and the second transmission portion extending substantially an entire thickness of the bulk portion, wherein an exterior surface of the optical component comprises an average surface roughness ($R_a$) of less than 10 microns.

9. The optical component of claim 8, wherein the bulk portion comprises the second material.

10. The optical component of claim 8, wherein the first transmission portion has a non-linear profile.

11. The optical component of claim 8, wherein the first transmission portion has a first area at an external surface defined by the optical component and the second transmission portion has a second area at the external surface, the first area different from the second area.

12. The optical component of claim 8, wherein the first material, the second material, and the third material comprise glass.

13. The optical component of claim 8, wherein the third region and the sixth region comprise extra-mural absorption glass.

14. An optical component for an electronic device, comprising:
a first transmission portion comprising an array of fibers comprising a first material having a first index of refraction, a periphery of each fiber surrounded by a first region comprising a second material having a second index of refraction that is lower than the first index of refraction, and a periphery of the first transmission portion surrounded by a second region;
a second transmission portion comprising the first material, a periphery of the second transmission portion surrounded by a third region comprising the second material and a fourth region comprising a third material, the second transmission portion spaced apart from the first transmission portion; and
a bulk portion at least partially surrounding the periphery of the first transmission portion and the periphery of the second transmission portion, wherein the first material, the second material, and the third material are fused together.

15. The optical component of claim 14, wherein the second transmission portion comprises a second array of fibers of the first material, a periphery of each fiber of the second array surrounded by fifth regions comprising the second material.

16. The optical component of claim 14, wherein the first material comprises sapphire and the second material comprises glass.

17. The optical component of claim 14, wherein the second region and the fourth region comprise extra-mural absorption glass.

18. The optical component of claim 14, further comprising a light-absorbing material disposed between each of the fibers.

19. The optical component of claim 15, wherein the second index of refraction is at least 0.25 lower than the first index of refraction.

* * * * *

UNITED STATES PATENT AND TRADEMARK OFFICE
CERTIFICATE OF CORRECTION

PATENT NO. : 12,253,728 B2
APPLICATION NO. : 17/456614
DATED : March 18, 2025
INVENTOR(S) : Vivek Venugopal et al.

Page 1 of 1

It is certified that error appears in the above-identified patent and that said Letters Patent is hereby corrected as shown below:

On the Title Page

Item (60) add:
Provisional application No. 63/167,491, filed on Mar. 29, 2021
Provisional application No. 63/119,231, filed on Nov. 30, 2020

Signed and Sealed this
Sixteenth Day of September, 2025

Coke Morgan Stewart
*Acting Director of the United States Patent and Trademark Office*